United States Patent
Van Duuren et al.

(10) Patent No.: US 7,952,932 B2
(45) Date of Patent: May 31, 2011

(54) SONOS-BASED NON-VOLATILE MEMORY AND-ARRAY

(75) Inventors: Michiel J. Van Duuren, Valkenswaard (NL); Robertus T. F. Van Schaijk, Eindhoven (NL)

(73) Assignee: NXP B.V., Eindhoven (NL)

( * ) Notice: Subject to any disclaimer, the term of this patent is extended or adjusted under 35 U.S.C. 154(b) by 308 days.

(21) Appl. No.: 12/307,282

(22) PCT Filed: Jul. 3, 2007

(86) PCT No.: PCT/IB2007/052575
§ 371 (c)(1),
(2), (4) Date: Jan. 2, 2009

(87) PCT Pub. No.: WO2008/004179
PCT Pub. Date: Jan. 10, 2008

(65) Prior Publication Data
US 2009/0225604 A1    Sep. 10, 2009

(30) Foreign Application Priority Data

Jul. 4, 2006    (EP) .................................... 06116574

(51) Int. Cl.
*G11C 16/04*    (2006.01)
(52) U.S. Cl. ......... 365/185.18; 365/185.05; 365/185.17; 365/185.29
(58) Field of Classification Search ............. 365/185.18, 365/185.05, 185.17, 185.29
See application file for complete search history.

(56) References Cited

U.S. PATENT DOCUMENTS

| | | | | |
|---|---|---|---|---|
| 5,812,450 A * | 9/1998 | Sansbury et al. | ........ | 365/185.01 |
| 6,002,610 A * | 12/1999 | Cong et al. | ................ | 365/185.05 |
| 6,108,239 A * | 8/2000 | Sekariapuram et al. | . | 365/185.28 |
| 6,549,476 B2 | 4/2003 | Pinney | | |
| 7,008,856 B2 | 3/2006 | Han et al. | | |
| 7,170,128 B2 * | 1/2007 | Lojek | ............................ | 257/314 |
| 7,212,438 B2 * | 5/2007 | Gratz et al. | ............. | 365/185.05 |
| 7,339,820 B2 | 3/2008 | Kato | | |
| 2002/0008993 A1 * | 1/2002 | Hayashi | ................... | 365/185.18 |

FOREIGN PATENT DOCUMENTS

| | | |
|---|---|---|
| EP | 0588402 A2 | 3/1994 |
| WO | 94/10686 A1 | 5/1994 |

* cited by examiner

*Primary Examiner* — Connie C Yoha

(57) ABSTRACT

Consistent with an example embodiment, a non-volatile memory cell on a semiconductor substrate includes a first and a second transistor. Each transistor is arranged as a memory element that includes two diffusion regions capable of either acting as a source or drain, a charge storage element and a control gate element. A channel region is located intermediate the two diffusion regions. The charge storage element is located over the channel region and the control gate element is arranged on top of the charge storage element. One diffusion region of the first transistor and one diffusion region of the second transistor form a common diffusion region. The other diffusion region of the first transistor is connected as first diffusion region to a first bit line, the other diffusion region of the second transistor is connected as second diffusion region to a second bit line and the common diffusion region is connected to a sensing line.

21 Claims, 16 Drawing Sheets

SONOS-BASED NON-VOLATILE MEMORY AND-ARRAY

FIELD OF THE INVENTION

The present invention relates to a non-volatile memory cell. Also, the present invention relates to a non-volatile memory AND-array. Moreover, the present invention relates to a layout of such a non-volatile memory AND-array. Further, the present invention relates to a method of operating such a non-volatile memory AND-array.

BACKGROUND OF THE INVENTION

A non-volatile memory AND-array is known from international application WO 94/10686.

The AND-array comprises a plurality of memory cells which each consist of a stacked gate transistor comprising a floating gate which is capable of storing electric charge and a control gate which is capable to control operations on the floating gate, i.e., reading, writing, and erasing.

In the AND-array configuration, the memory cells are arranged in rows and columns. Memory cells in the same row share a word-line which is connected to each of their control gates. Memory cells in the same column share one bit line which is connected to each of their sources and another bit line which is connected to each of their drains.

The AND-array configuration may be an alternative for memory arrays with two-transistor (2T) memory cells. For instance, both array configurations allow programming by means of Fowler-Nordheim (FN) tunneling. In 2T memory cells, the stacked gate transistor is paired with an additional access transistor.

In earlier process generations the size of a memory cell in an AND-array was typically larger than in a 2T-array because the need for two bit lines per cell imposed a much larger column pitch, but for more advanced process generations ("break-even" is around the 90 nm node), the AND-array configuration may offer a smaller cell size than 2T mainly due to the fact that the length of the access transistor of a 2T memory cell can not be downscaled further, leading to a much larger row pitch in the 2T configuration.

Moreover, the AND-array configuration may provide a larger read current than the 2T configuration which can favorably be applied in a non-volatile memory AND-array based on SONOS (Silicon-Oxide-Nitride-Oxide-Silicon) or other charge trapping cells. This higher read current can be realized thanks to the absence of the access gate (AG) transistor, which in series with the control gate transistor limits the current in a 2T cell. Additionally, in the AND-array configuration a higher program inhibit voltage can be applied than in the 2T configuration. In the 2T configuration, a higher program inhibit voltage would cause punch-through of the access transistor, but obviously in the AND-array configuration this is not an issue, since both bit lines can be biased at the inhibit voltage.

In non-volatile semiconductor devices based on SONOS, charge can be stored in the silicon nitride layer of the ONO stack by a mechanism of (direct) tunneling of electrons through the bottom silicon dioxide layer (tunnel-oxide layer) from the current carrying channel to the silicon nitride layer.

The charge trapping properties of the silicon nitride layer allow for downscaling the thickness of the tunnel-oxide layer, which may result in lower program/erase voltages.

Alternatively, the "SONOS" material stack can comprise other materials than $SiO_2$ or $Si_3N_4$, such as $Al_2O_3$, $HfO_2$, $HfSiO$, $HfSiON$, $ZrO_2$, etc. For the sake of clarity, the entire class of charge trapping cells is referred to as "SONOS" in the remainder of this document.

Disadvantageously, SONOS memory devices suffer from a gate disturb effect, for example during the read action.

Gate disturb relates to a disturbance of a threshold voltage $V_T$ of a memory cell and is caused by exposure to a relatively large voltage difference between the channel region of the cell and the control gate, leading to a relatively large electric field in the ONO stack, which can gradually change the charge in the nitride by soft programming or soft erase. As a consequence the level of the threshold voltage $V_T$ which defines the memory state, or bit value, of the memory cell (being either '0' or '1', depending on the actual threshold voltage of the memory cell being above or below the voltage applied to the control gate during read, $V_{CG,read}$), tends to change gradually over the lifetime of the memory cell.

For example, gate disturb due to the application of a voltage on the control gate of the memory cell during a read operation may cause a slow programming of the memory cell, i.e., some tunneling takes place during reading.

Also, in comparison to non-volatile memory devices based on a floating gate, SONOS memory devices suffer from a relatively low data retention capability. On the other hand, an advantage of SONOS-like memories is the absence of strong extrinsic behavior, i.e., the behavior of different cells is to a great extent identical.

SUMMARY OF THE INVENTION

It is an object of the present invention to reduce the effect of gate disturb in SONOS based AND-array memory.

This object is achieved by a non-volatile memory cell on a semiconductor substrate comprising a first and a second transistor, each transistor being arranged as a memory element comprising two diffusion regions capable of acting as either source or drain, a charge storage element and a control gate element, a channel region being located intermediate the two diffusion regions; the charge storage element being located over the channel region, the control gate element being arranged on top of the charge storage element; one diffusion region of the first transistor and one diffusion region of the second transistor being a common diffusion region; the other diffusion region of the first transistor being connected as first diffusion region to a first bit line, the other diffusion region of the second transistor being connected as second diffusion region to a second bit line and the common diffusion region being connected to a sensing line.

Advantageously, the differential configuration of the non-volatile memory cell allows to determine the bit value of a memory cell from the relative difference of the threshold voltage $V_T$ of two memory transistors which during the lifetime of the memory experience the same disturbs. Since the two transistors are subjected to the same disturbs, the effect on their threshold voltage $V_T$ will be similar. By measuring the threshold voltage $V_T$ of each of the two transistors and by taking the difference between the measured threshold voltages the bit value of the memory cell may be determined. The differential measurement thus allows to ignore a change of threshold voltage due to disturb.

The present invention relates to a non-volatile memory AND-array wherein the first, second and common diffusion region have a relatively larger size, along the first direction, in comparison to a size of the channel regions along the first direction, the first direction being at a non-zero angle with the second direction;

the first and second diffusion regions protruding along the first direction in comparison to a central position of the channel regions, and the common diffusion region protruding along the first direction in comparison to the central position of the channel regions, the protruding direction of the common diffusion region being opposite to the protruding direction of the first and second diffusion regions.

Advantageously, the arrangement allows to create a non-volatile memory cell which relatively reduces the occupied area size by about 25%.

The present invention further relates to a layout of a non-volatile memory AND-array comprising a plurality of non-volatile memory cells as described above, the non-volatile memory cells each having a pair of a first and a second memory transistor, and the non-volatile memory cells being arranged in a configuration of at least one column and at least one row, the diffusion region of first memory transistors in the same at least one column connecting to the same first bit line, the diffusion region of the associated second memory transistors in the same at least one column connecting to the same second bit line, and the common diffusion region of the first and second memory transistors in the same at least one column connecting to the same sensing line;

in the at least one row, the first control gate line extending in a row direction to connect to the first control gate element of each first memory transistor that is on the same at least one row, and the second control gate line extending in the row direction to connect to the second control gate element of each second memory transistor that is in the same at least one row.

Further, the present invention relates to a method of operating such a non-volatile memory AND-array as described above, the method of operating comprising:

exposing the first transistor of a non-volatile memory cell to a first voltage between the control gate and the channel region and exposing the second transistor of the non-volatile memory cell to a second voltage between the control gate and the channel region, the second voltage being substantially identical to the first voltage.

Advantageously, if two substantially identical non-volatile memory cells are experiencing a substantially identical pattern of voltage exposures between their respective control gate and channel region, the gate disturbs experienced by both transistors are substantially identical and the threshold voltage of both cells due to gate disturb will change in a similar way.

BRIEF DESCRIPTION OF DRAWINGS

The invention will be explained in more detail below with reference to a few drawings in which illustrative embodiments of the invention are shown. It will be appreciated by the person skilled in the art that other alternative and equivalent embodiments of the invention can be conceived and reduced to practice without departing from the true spirit of the invention, the scope of the invention being limited only by the appended claims.

DETAILED DESCRIPTION

Figure 1:
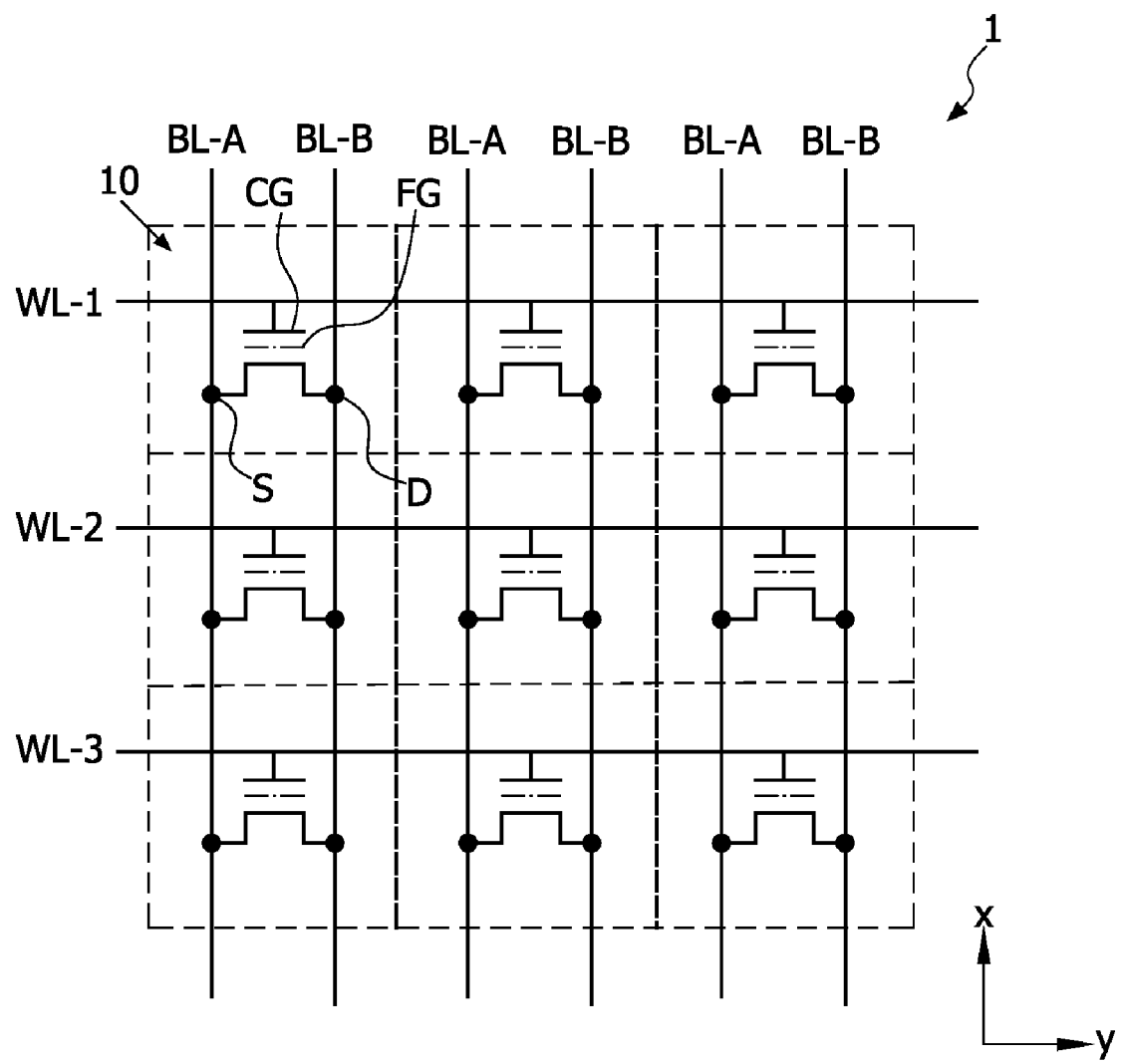
FIG. 1 shows a schematic of a non-volatile memory AND-array of the prior art.

FIG. 1 shows a schematic of a non-volatile memory AND-array of the prior art.

The non-volatile memory AND-array of the prior art 1 comprises a plurality of non-volatile memory cells. Each non-volatile memory cell comprises a stacked gate field effect transistor with a floating gate FG and a control gate CG. The floating gate FG is capable of storing electric charge and the control gate CG is capable to control operations on the floating gate FG, i.e., reading, writing, and erasing. Alternatively, the FG can be replaced by a charge trapping dielectric.

In the AND-array 1 from the prior art a single memory cell 10 is indicated by the dashed-line rectangle. In the AND-array configuration, the memory cells are arranged in rows and columns. Memory cells in the same row share a word-line WL1, WL2, WL3 which is connected to the control gate of each memory cell in that row. Memory cells in the same column share one bit line BL-A which is connected to the source S and another bit line BL-B which is connected to the drain D of each memory cell in that column.

Figure 2:
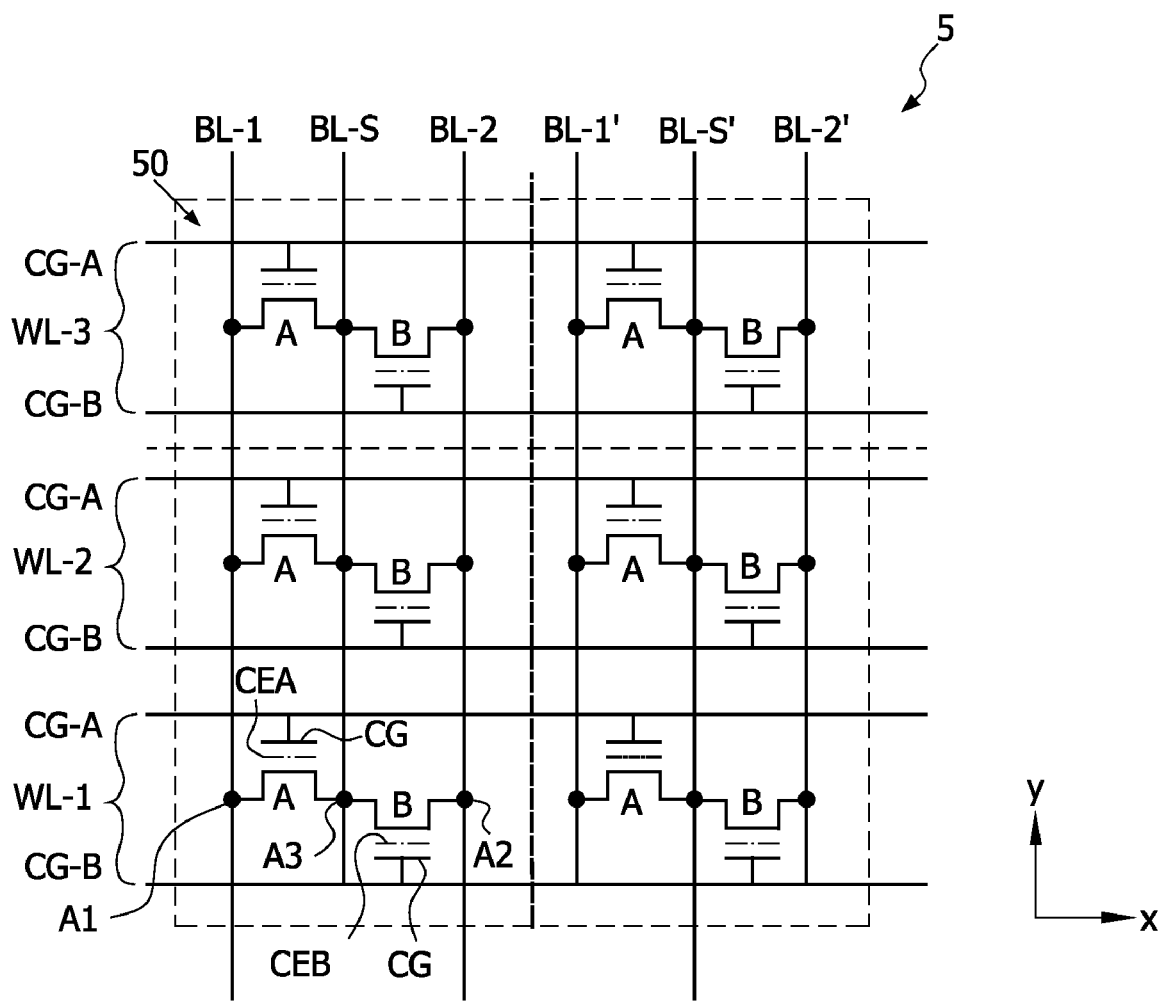
FIG. 2 shows a schematic of a non-volatile memory AND-array according to the present invention.

FIG. 2 shows a schematic of a non-volatile memory AND-array according to the present invention.

The non-volatile memory AND-array 5 according to the present invention comprises a plurality of non-volatile memory cells which are also arranged in a row and column matrix. The rows extend in a first direction X, the columns in a second direction Y.

In the non-volatile memory AND-array 5 of the present invention a single memory cell 50 is indicated by the dashed-line rectangle. Each memory cell in the AND-array has a differential configuration in that the non-volatile memory cell comprises a pair of first and second memory field effect transistors A, B. The first and second memory transistors A, B in each memory cell are arranged adjacent to each other in a linear way along the long axis of the dashed-line rectangle in the second direction Y. Each of the memory transistors A, B comprises a charge storage element CEA; CEB and a control gate CG.

In the present invention, the non-volatile memory cell is based on SONOS technology and the charge storage element CEA; CEB consists of a charge trapping layer comprising an ONO stack.

Of the pair of memory transistors A, B, the control gate CG of the first memory transistor A is connected to a first control gate line CG-A and the control gate CG of the second memory transistor B is connected to a second control gate line CG-B.

Each of the transistors A, B has a pair of diffusion regions of which one diffusion region within the respective transistor can act as source and the other diffusion region as drain.

One diffusion region A1 of the first memory transistor A is connected to a first bit line BL-1 and the other diffusion region A3 of the first memory transistor A is connected to a sensing line BL-S.

Similarly, one diffusion region A2 of the second memory transistor B is connected to the second bit line BL-2 and the other diffusion region A3 of the second memory transistor B is connected to the sensing line BL-S.

The other diffusion region A3 of the first memory transistor A is combined with the other diffusion region A3 of the second memory transistor B as a common diffusion region A3 of the pair of memory transistors A, B.

Below, the diffusion region A1 of the first transistor A is denoted as the first diffusion region A1 and the diffusion region A2 of the second transistor B is denoted as second diffusion region A2 of the memory cell 50, i.e., the pair of transistors.

In each memory cell 50 the first and second control gate line CG-A, CG-B together make up a differential word line WL1; WL2; WL3 as will be illustrated in more detail below.

In an embodiment of a non-volatile memory AND-array according to the present invention, the AND array comprises of a plurality of first and second memory transistor pairs A, B, which pairs are arranged in substantially a column and row configuration.

Columns extend in second direction Y, rows extend in first direction X at a non-zero angle with the second direction Y. In a preferred embodiment the angle between X and Y is 90°, but other angle values may be possible as well.

The diffusion region of first memory transistors A in the same column connect to the same first bit line BL-1, the diffusion region of the associated second memory transistors B in the same column connect to the same second bit line BL-2, and the common drain/source A3 of the first and second memory transistors in the same column connect to the same sensing line BL-S. In each row, the first control gate line CG-A extends in the row direction to connect the control gate of each first memory transistor A that is in the same row. Similarly, in each row the second control gate line CG-B extends in the row direction to connect the control gate of each second memory transistor B that is in the same row. Thus a differential word line extends in the row direction in each row.

First, the method of operating the non-volatile memory cell and the AND-array of the present invention is described in more detail. Then, embodiments of non-volatile memory cells according to the present invention are described.

The present invention is based on the perception that if two substantially identical non-volatile memory cells are experiencing a substantially identical pattern of voltage exposures between their respective control gate and channel region, the gate disturbs experienced by both transistors are substantially identical and the threshold voltage of both cells due to gate disturb will change in a similar way.

Advantageously, the sign of the difference in threshold voltage between a programmed memory cell (bit value '1') and a non-programmed memory cell (bit value '0'), that are both conditioned with similar gate disturbs, can thus remain substantially the same over time. Below this concept will be explained in more detail.

Initially, all memory cells in the AND-array are in an erased state, i.e., all "A" and "B" transistors are in a low-$V_T$ state (but, of course, $V_T>0V$ for both transistors in order to prevent over-erase).

If data is to be stored in a cell (i.e., electronic charge is to be stored in the charge trapping layer of the charge storage element CEA; CEB), only one of the two transistors, for example memory transistor A, is programmed, the other one (in this case memory transistor B) is not programmed. This will cause one transistor to have a higher threshold voltage $V_T$ than the other one. Defining the cell content or bit value to be "0" if $V_{T,A}>V_{T,B}$ and "1" if $V_{T,A}<V_{T,B}$, this allows a robust read-out scheme, despite the fact that due to gate disturb, the absolute values of the $V_T$ of the memory transistors A, B are not stable. $V_{T,A}$ relates to a first threshold voltage of the first transistor A, $V_{T,B}$ relates to a second threshold voltage of the second transistor B. A certain threshold difference $\Delta V_T=(V_{T,A}-V_{T,B})$ between the programmed and the non-programmed memory transistor will exist irrespective of the absolute threshold voltage level of each transistor A, B, as both transistors A, B are subjected to the same disturbs, aging, etc. during the lifetime of the memory cell. The sign of the threshold voltage difference $\Delta V_T$ can be used to indicate the bit value of the non-volatile memory cell (bit value='0' if $\Delta V_T>0$, bit value='1' if $\Delta V_T<0$).

Advantageously, the differential configuration of the non-volatile memory cell allows to determine the bit value of a memory cell from the relative difference of the threshold voltage of two memory transistors A, B which are arranged for substantially receiving similar exposure to gate disturbs during the lifetime of the memory. Since the two memory transistors A, B are subjected to substantially the same gate disturbs, the effect on their threshold voltage may be similar. By measuring the threshold voltage $V_T$ of each of the two memory transistors and by taking the difference between the measured threshold voltages the bit value of the memory cell may be determined. The differential measurement thus allows to ignore a change of threshold voltage of individual memory transistors due to gate disturb.

Instead of a $V_T$ measurement, also the channel currents of both memory transistors can be compared, as will be appreciated by those skilled in the art.

The strength of the differential read-out lies in the fact that extrinsic transistors do not occur in SONOS memories, which implies that all external disturbs (e.g., the already mentioned gate disturb) have the same effect on both transistors in the cell, so the mutual difference is barely affected.

Erasing of the non-volatile memory cell 50 can be done by applying an erasure voltage $V_E$ (typically a relatively large negative voltage, approximately −12V) to the control gates CG of both memory transistors A and B through the first control gate line CG-A and the second control gate line CG-B, respectively. At the same time the first bit line BL-1, the second bit line BL-2 and the sensing line BL-S are kept at substantially zero voltage (0V).

In a first programming mode, programming of the non-volatile memory cell 50 (e.g., the first transistor A is to be programmed, second transistor B is not) can be done by applying, in a first action, a positive programming pulse $V_P$ (typically a large positive voltage, about 12V) to the control gate CG of the first memory transistor A of the non-volatile memory cell to be programmed through the first control gate line CG-A, at the same time inhibiting programming of all other non-volatile memory cells sharing the same control gate line CG-A that should not be programmed by biasing the bit and sensing lines BL-1, BL-2, BL-S of those other non-volatile memory cells at a positive inhibit voltage $V_I$ (about 5V to about 7V); then, in a subsequent action, applying a positive programming pulse (about 12V) to the second control gate CG of the second memory transistor B through the second control gate line CG-B, while at the same time again inhibiting all cells on the same control gate line CG-B including the second memory transistor B which should not be affected by the programming pulse by applying a positive inhibit voltage on the corresponding bit and sensing lines BL-1, BL-2, BL-S.

In this manner, all memory cells on the same differential word line experience a similar gate disturb.

In a second programming mode, one could apply a page mode write by programming all relevant memory A transistors of all non-volatile memory cells on the same differential word line during the first programming pulse on CG-A while at the same time applying an appropriate inhibit pattern to apply the inhibit voltage $V_1$ to all memory A transistors on the same differential word line that should not be programmed. After inverting the inhibit pattern then all relevant memory B transistors, i.e., those B transistors of which the accompanying A transistor was not programmed during the first programming pulse, are programmed during the second programming pulse, which is only applied to CG-B.

As an alternative for the first programming mode, the positive programming pulse can be applied to only one CG, namely the one to be programmed (in this example memory transistor A), which speeds up the programming process by a factor of 2. However, in this case, an imbalance arises in the disturbs that are "experienced" by the non-selected cells on the same differential word line (the programming pulse only exerts a gate disturb on one of the two gates, in this case of transistor A). This is not beneficial for the differential read-out scheme, which relies on a "disturb symmetry" between the two transistors A, B forming a pair, i.e., the first and second transistors A, B experience substantially a same history of gate disturbs.

Reading of the non-volatile memory cell 50 can be done by biasing the central sense line BL-S with a sensing voltage $V_S$ of about +1V with respect to the first and second bit lines BL-1 and BL-2. The control gate CG of the first memory transistor A and the control gate CG of the second memory transistor B should be biased at the read voltage $V_R$ (for instance 2.5V).

Note that although a slight programming of both memory transistors A, B may occur during reading, due to the differential read-out scheme of the threshold voltages of memory transistors A and B it is still possible to determine the bit value of the non-volatile memory cell 50.

A sense amp (not shown) connected between the first and second bit lines BL-1, BL-2 of the non-volatile memory cell 50 to be read, compares currents $I_{BL-1}$, $I_{BL-2}$ on the respective bit lines: if $I_{BL-1} > I_{BL-2}$, the memory cell 50 contains a "1", and if $I_{BL-1} < I_{BL-2}$ the memory cell 50 represents a "0".

Note that reading before programming results in an unpredictable result: both "1" and "0" can occur. In an application of memory using the non-volatile memory cell of the present invention, a file system (program or controller device) should be able to handle this situation.

Figure 3A:
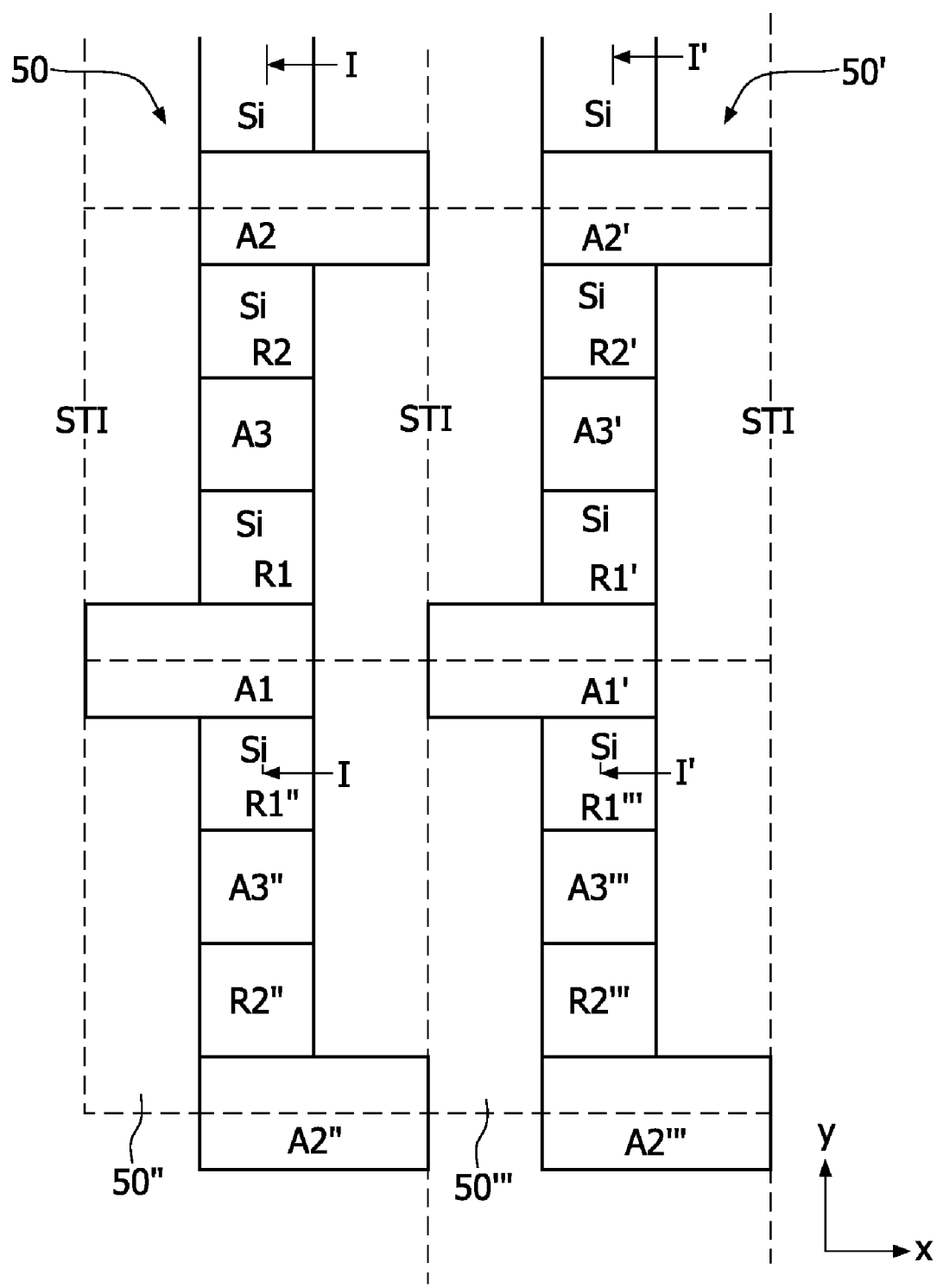
FIGS. 3a, 3b, 3c show a top view of an arrangement of memory cells in the AND-array according to a first embodiment.
Figure 3B:
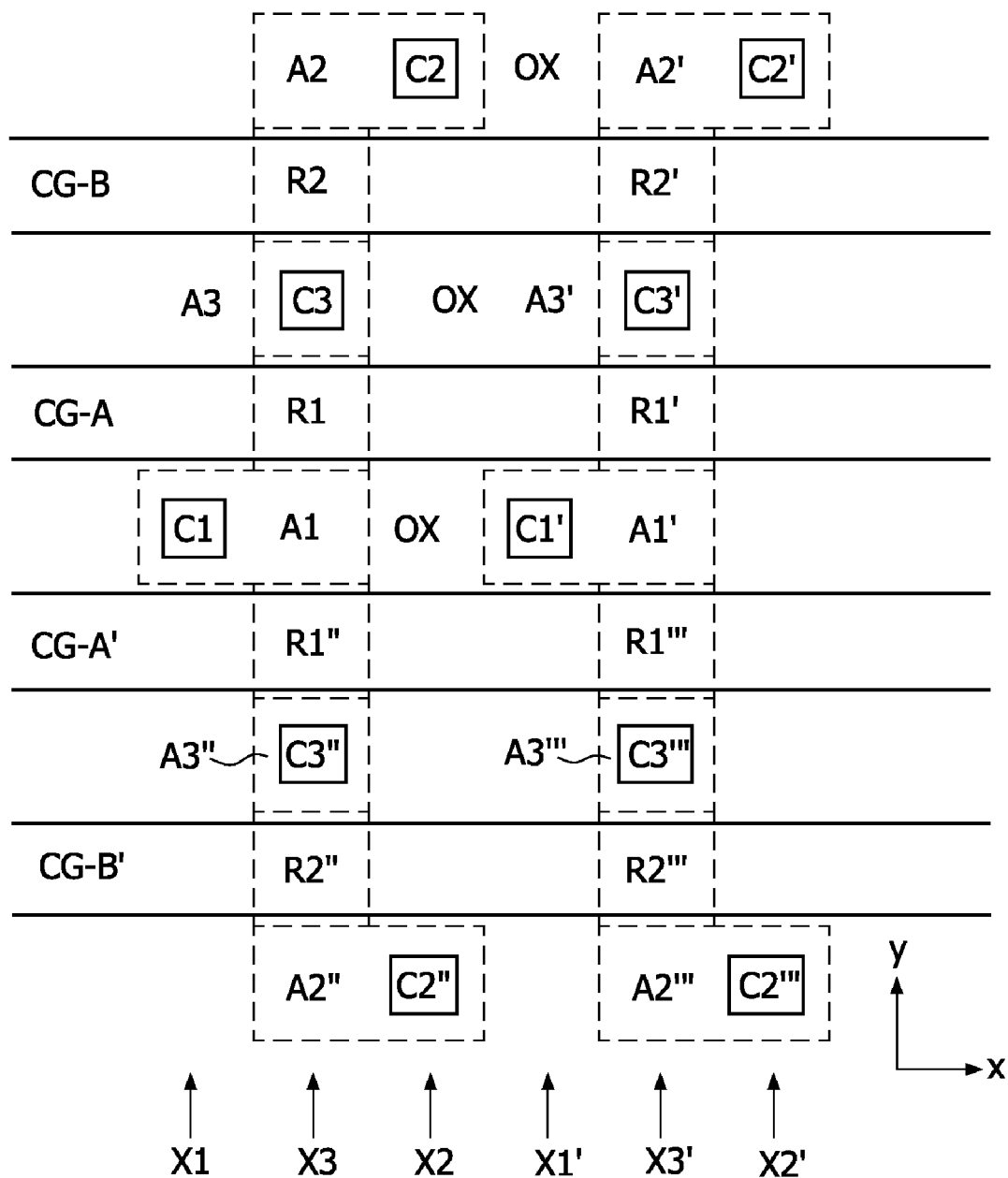
Figure 3C:
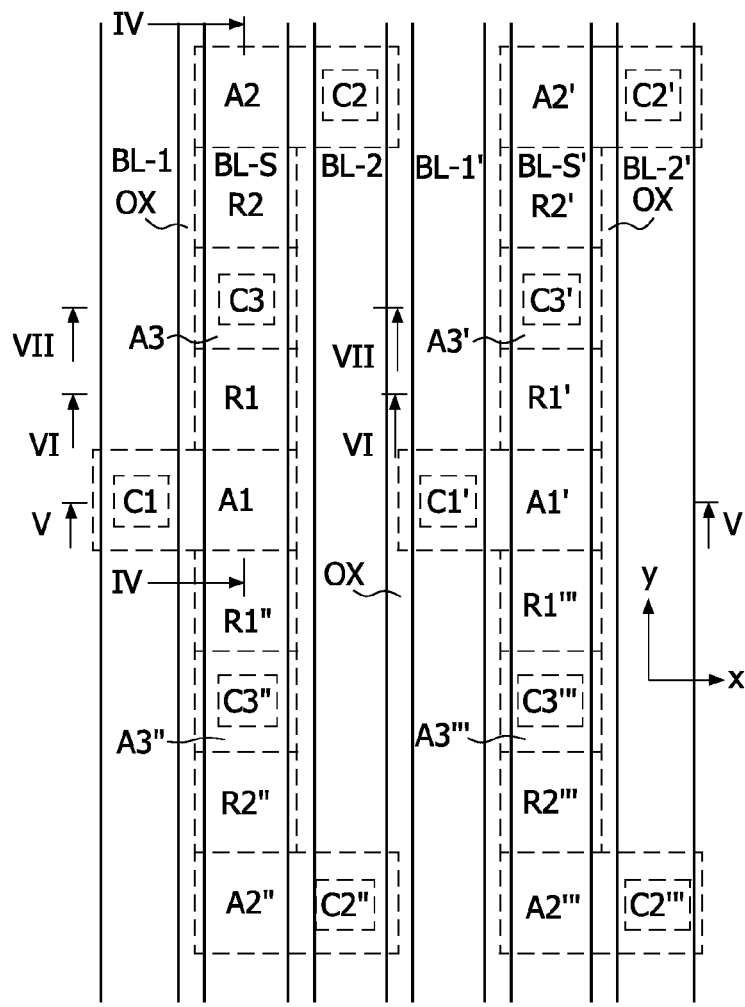

FIGS. 3a, 3b, 3c show a top view of an arrangement of non-volatile memory cells in the AND-array according to a first embodiment.

The non-volatile memory cells 50, 50', 50", 50''' are arranged on a semiconductor substrate 100.

In FIG. 3a the arrangement of two adjacent non-volatile memory cells 50, 50' is shown on a level of a zero layer (i.e., the surface of the semiconductor substrate). The non-volatile memory cells 50, 50' are schematically demarcated by dashed-line rectangles.

In the arrangement two non-volatile memory cells 50, 50' adjacent in the first direction X are shown, and two non-volatile memory cells 50", 50''' adjacent in the second direction Y (at a non-zero angle with the first direction X).

Each non-volatile memory cell 50; 50' comprises a first diffusion region A1; A1' and a second diffusion region A2; A2' which are to be connected to the first bit line BL-1; BL-1' and the second bit line BL-2; BL-2', respectively.

In between the first diffusion region A1; A1' and the second diffusion region A2; A2' a common (third) diffusion region A3; A3' is arranged which is connected to the sensing line BL-S; BL-S'.

In the semiconductor substrate a further active area Si extends in a second direction Y along line I-I; I'-I', for providing channel regions R1; R1' in between the first diffusion region A1; A1' and the common diffusion region A3; A3', and channel regions R2; R2' in between the second diffusion region A2; A2' and the common diffusion region A3; A3'.

The first memory transistor A is to be created between the first diffusion region A1; A1' and the common diffusion region A3; A3'. The second memory transistor B is to be created between the second diffusion region A2; A2' and the common diffusion region A3; A3'.

The channel regions R1, R2 and adjacent diffusion regions A1, A2, A3 of non-volatile memory cell 50 are isolated from the same regions R1', R2', A1', A2', A3' in adjacent non-volatile memory cell 50' by means of a shallow trench isolation STI.

In the non-volatile memory cell 50; 50'; 50"; 50''' the first, second and common diffusion regions A1; A1'; A1"; A1'''; A2; A2'; A2"; A2'''; A3; A3'; A3"; A3''' are arranged in a "staggered" fashion. In comparison to the horizontal size (along direction X) of channel regions R1, R2; R1', R2'; R1", R2"; R1''', R2''' and the common diffusion region A3; A3'; A3"; A3''' the first and second diffusion regions A1; A1'; A1"; A1'''; A2; A2'; A2"; A2''' have a relatively larger horizontal size (along direction X).

The first diffusion region A1; A1'; A1"; A1''' protrudes over a first distance (along direction X) while the second diffusion region A2; A2'; A2"; A2''' protrudes over a second distance (along direction X) with opposite direction in comparison to the first distance.

In FIG. 3b the arrangement of two adjacent non-volatile memory cells 50, 50' is shown on a level of the control gate lines (differential word lines).

The channel regions R1, R2; R1', R2'; R1", R2"; R1''', R2''' and adjacent diffusion regions A1, A2, A3; A1', A2', A3'; A1", A2", A3"; A1''', A2''', A3''' of non-volatile memory cell 50; 50'; 50"; 50''' are depicted by dashed line outlines to indicate that they are located below the word line level.

The first control gate line CG-A; CG-A' is positioned above the first channel region R1, R1'; R1", R1''' of the adjacent non-volatile memory cells 50, 50'; 50", 50''' and extends along the first direction X. Intermediate the first channel region R1; R1'; R1"; R1''' and the first control gate line CG-A, CG-A' a charge storage element (not shown) is located. This will be illustrated below. This charge storage element can be a floating gate, but preferentially, it consists of a charge trapping dielectric, such as silicon nitride. The charge storage element is sandwiched between two isolators, e.g., silicon oxide.

The second control gate line CG-B; CG-B' is positioned above the second channel region R2; R2'; R2", R2''' of the adjacent non-volatile memory cells 50, 50'; 50", 50''' and extends along the first direction X. Likewise, intermediate the second channel region R2; R2'; R2"; R2''' and the second control gate line CG-B; CG-B' a charge storage element (not shown) is located.

It is noted that the first and second control gate lines are not located above the rectangular areas A1, A2, A3; A1', A2', A3'; A1", A2", A3"; A1''', A2''', A3'''.

On each of the first, second and common (third) diffusion regions A1, A2, A3; A1', A2', A3'; A1", A2", A3"; A1''', A2''', A3''' a respective first, second and third contact C1, C2, C3; C1', C2', C3'; C1", C2", C3"; C1''', C2''', C3''' is arranged for connecting to the bit-lines and sensing lines BL-1, BL-2, BL-S; BL-1', BL-2', BL-S', respectively, at a higher level (not shown here) which will be illustrated in more detail in FIG. 3c.

The first contact C1; C1'; C1"; C1''' on the first diffusion region A1; A1'; A1"; A1''' has a horizontal position X1; X1' along first direction X which is relatively displaced in the one horizontal direction in comparison with a horizontal central position X3; X3' of the third contact C3; C3'; C3"; C3''' on the common diffusion region A3; A3'; A3"; A3''' (and of the channel regions R1, R2; R1', R2'; R1", R2"; R1''', R2''').

The second contact C2; C2'; C2"; C2''' on the second diffusion region A2; A2'; A2"; A2''' has a horizontal position X2; X2' along first direction X which is relatively displaced in the opposite horizontal direction in comparison with the central horizontal position X3; X3' of the third contact C3; C3'; C3"; C3''' on the common diffusion region A3; A3'; A3"; A3''' (and of the channel regions R1, R2; R1', R2'; R1", R2"; R1''', R2'''). In this manner the contacts follow the staggered arrangement of the diffusion regions in each memory cell.

The control gate lines CG-A, CG-B comprise sidewall spacers (not shown here). In between the control gate lines a dielectric OX (silicon dioxide) is present to electrically isolate the control gate lines and contacts from each other. Alternatively, this dielectric can replaced by a material with a lower dielectric constant, or even by air in order to reduce the capacitive cross talk between both gates.

In FIG. 3c the arrangement of adjacent non-volatile memory cells 50, 50', 50", 50''' is shown on a level of the bit lines and sensing lines.

For reason of clarity, the control gate lines are not shown here. It is noted that in the first embodiment the bit lines BL-1, BL-2; BL-1', BL-2' and the sensing lines BL-S; BL-S' are located in the same level, for example the level often identified as metal-1 (M1). The staggered arrangement of diffusion region areas in each memory cell and the corresponding staggered position of the contact on diffusion region allows that the first and second bit lines and the sensing line in each column can extend as substantially straight lines in the second (vertical) direction Y.

The bit lines and sensing lines extend along the second direction Y and are isolated from each other by an intermediate dielectric OX (e.g. silicon dioxide).

Note that in two non-volatile memory cells adjacent to each other in the direction Y, the order of memory transistors A and B in one of the memory cells is reversed in comparison to the other neighbor memory cell. Thus in direction Y a series of memory cells can be described by the order of A and B memory transistors in that direction as follows: AB (a first cell), BA (second cell), AB, BA, AB, BA, AB, BA, and so on.

Diffusion regions A1 of adjacent A transistors can thus be combined to a common diffusion region A1 of the A transistors, and diffusion regions A2 of adjacent B transistors can thus be combined to a common diffusion region A2 of the B transistors.

Figure 4:
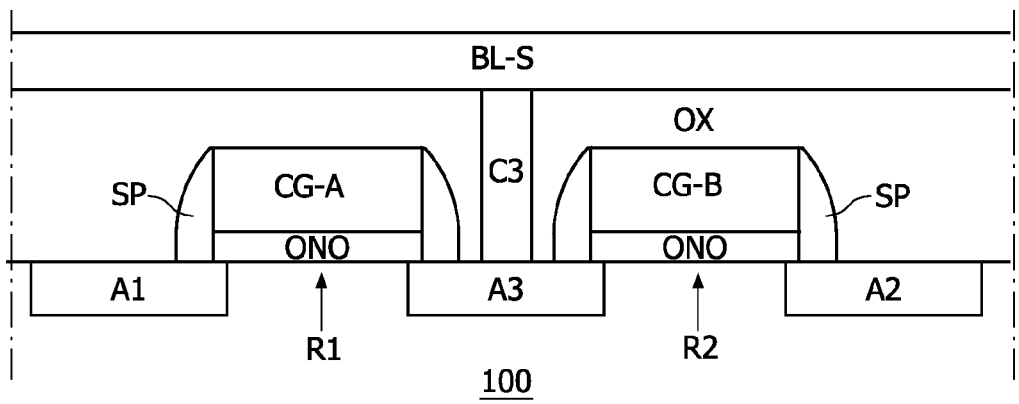
FIG. 4 shows a first cross-sectional view of a memory cell in the AND-array of the first embodiment.

FIG. 4 shows a memory cell in the AND-array of the first embodiment in a first cross-section along line IV-IV.

In the surface Z of the semiconductor substrate 100 the first, second and common diffusion regions A1, A2, A3 are located.

Intermediate the first and common diffusion regions A1, A3 the first channel region R1 is located, the second channel region R2 is intermediate the second and common diffusion regions A2, A3.

Above the first and second channel regions R1, R2 a memory transistor A, B is arranged. Each memory transistor A, B comprises a charge trapping element or layer ONO and a control gate CG-A, CG-B.

It is noted that after definition of the first, second and common diffusion regions A1, A2, A3 in between shallow trench isolation regions STI and after creation of the control gate lines, the diffusion regions are created by a self-aligned dopant process in which dopant species are supplied to the first, second and common diffusion regions A1, A2, A3, while the channel regions R1, R2 are masked by the control gate lines. Activation of the dopant species is achieved by a thermal treatment which is known in the art.

The charge trapping layer ONO abuts the respective channel region R1, R2. On top of the charge trapping layer ONO a control gate CG-A, CG-B is arranged. Side walls of each memory transistor A, B are covered by a dielectric spacer SP.

Each memory transistor A, B is covered by a preferably planarised dielectric layer OX. On top of the dielectric layer OX, a conductor line acting as the sensing line BL-S is arranged.

The contact C3 connects the common diffusion region A3 to the sensing line BL-S.

A further insulating layer (not shown) may be arranged on top of the sensing line BL-S.

Figure 5:
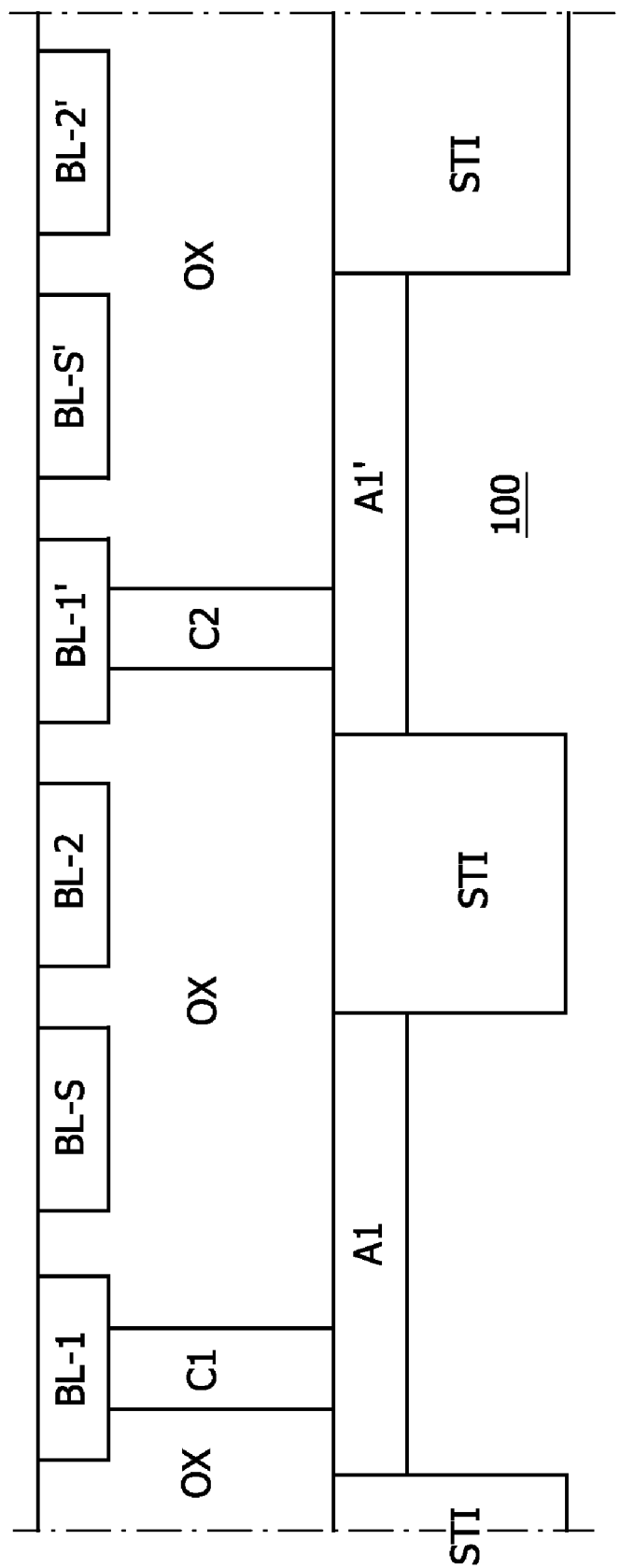
FIG. 5 shows a second cross-sectional view of a memory cell in the AND-array of the first embodiment.

FIG. 5 shows the memory cell in the AND-array of the first embodiment in a second cross-section along line V-V.

In the surface Z of the semiconductor substrate 100 the first diffusion region A1 of the memory cell 50 and the first diffusion region A1' of the adjacent memory cell 50' are arranged. The diffusion regions A1, A1' are separated by a shallow trench isolation region STI. The diffusion regions A1, A1' and the STI regions are covered by the dielectric layer OX. On top of the dielectric layer OX the bit lines BL-1, BL-2; BL-1', BL-2' and sensing line BL-S; BL-S' are positioned.

In the first direction X, the sensing line BL-S; BL-S' is arranged in between the first and second bit lines BL-1, BL-2; BL-1', BL-2'.

The bit lines and sensing lines may have a similar width wb and may be evenly distributed with a similar spacing in between them. The first bit line BL-1; BL-1' is arranged for connection to the first diffusion region A1, A1' by means of the contact C1, C1'.

In a similar way (not shown), the second bit line BL-2; BL-2' is arranged for connection to the second diffusion region A2; A2' by a second contact C2; C2'.

A further insulating layer (not shown) may be arranged in between and on top of the bit and sensing lines BL-1, BL-2, BL-S; BL-1', BL-2', BL-S'.

Figure 6:
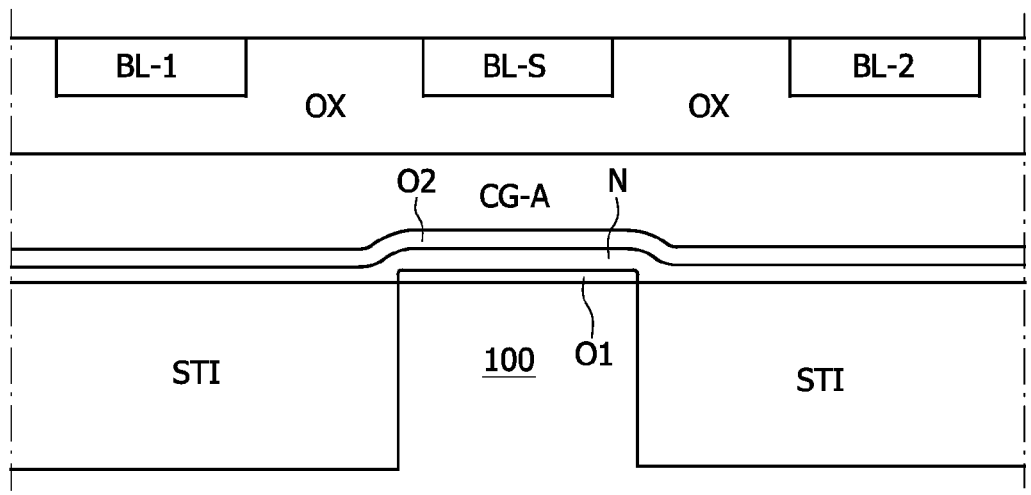
FIG. 6 shows a third cross-sectional view of a memory cell in the AND-array of the first embodiment.

FIG. 6 shows the memory cell in the AND-array of the first embodiment in a third cross section along line VI-VI. The third cross section VI-VI is parallel to the second cross-section V-V.

In the surface Z of the semiconductor substrate 100 the first channel region R1 is positioned between shallow trench isolation regions STI (along the first direction X). Above the channel region R1 the stack of the charge trapping layer ONO and the control gate CG-A is positioned.

The ONO charge trapping layer comprises a bottom silicon dioxide layer O1 which has been grown on the surface Z of the semiconductor substrate 100. Above the bottom silicon dioxide layer O1 the silicon nitride layer N is located. Due to the blanket mode deposition process of the silicon nitride layer N, the silicon nitride layer N extends along line VI-VI. On top of the silicon nitride layer N the top silicon dioxide layer O2 is located, which also extends along line VI-VI. Note that due to the electric properties of silicon nitride, and the device geometry charge trapped in the silicon nitride layer N will be localized above the channel region R1.

Typically, the thickness of the bottom silicon dioxide layer O1 is about 2 nm. The thickness of the silicon nitride layer N is about 6 nm, and the thickness of the top silicon dioxide layer O2 is about 8 nm.

It is noted that one or each of the top and bottom silicon dioxide layers O1, O2 may be replaced by a high-K material such as Hafnium-oxide $HfO_2$, Hafnium-silicate $Hf_xSi_{1-x}O_2$ ($0 \leq x \leq 1$), Hafnium-silicate-nitride HfSiON, Aluminum-oxide $Al_2O_3$ or Zirconium-oxide $ZrO_2$. Moreover, the silicon nitride layer N may be replaced by another trapping material, e.g. a layer of silicon nano-crystals embedded in an insulator or a suitable high-K material layer.

Above the control gate CG-A the dielectric layer OX is located. On top of the dielectric layer OX the bit lines BL-1, BL-2 and the sensing line BL-S are positioned. The sensing line BL-S is substantially positioned above the channel region R1, while in this cross-section VI-VI the first and second bit lines BL-1, BL-2 are located above the STI regions.

A further insulating layer (not shown) may be arranged in between and on top of the bit and sensing lines BL-1, BL-2, BL-S.

Figure 7:
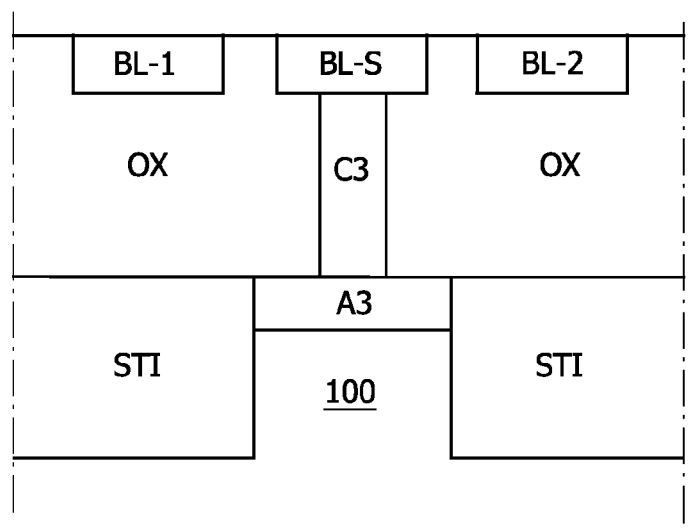
FIG. 7 shows a fourth cross-sectional view of a memory cell in the AND-array of the first embodiment.

FIG. 7 shows the memory cell in the AND-array of the first embodiment in a fourth cross-section along line VII-VII.

In the surface Z of the semiconductor substrate 100 the common diffusion region A3 of the memory cell 50 is arranged. The common diffusion region A3 is isolated in the X direction by shallow trench isolation regions STI. The common diffusion region A3 and the STI regions are covered by the dielectric layer OX. On top of the dielectric layer OX the bit lines BL-1, BL-2 and sensing line BL-S are positioned with the sensing line BL-S in between the first and second bit lines BL-1, BL-2.

The sensing line BL-S is arranged for connection to the common diffusion region A3 by means of the contact C3.

In this cross-section VII-VII the sensing line BL-S is substantially located above the common diffusion region A3, the first and second bit lines BL-1, BL-2 are substantially located above the STI region.

The non-volatile memory cell AND-array has a larger footprint than the AND-array from the prior art, since both the column pitch (3 instead of 2 metal pitches) and the word line pitch (two control gate lines instead of one) are larger. With common design rules, the difference is more than a factor of two. This is clearly a trade-off in spite of the advantages of the differential memory scheme.

In the following a second embodiment will be described which provides a better area efficiency. As shown below, the area of a non-volatile memory cell according to the second embodiment can be equal to twice the area of one non-differential memory cell.

FIGS. 8a, 8b, 8c, 8d show a top view of an arrangement of memory cells in the AND-array according to a second embodiment at different stages of the production process.

Figure 8A:
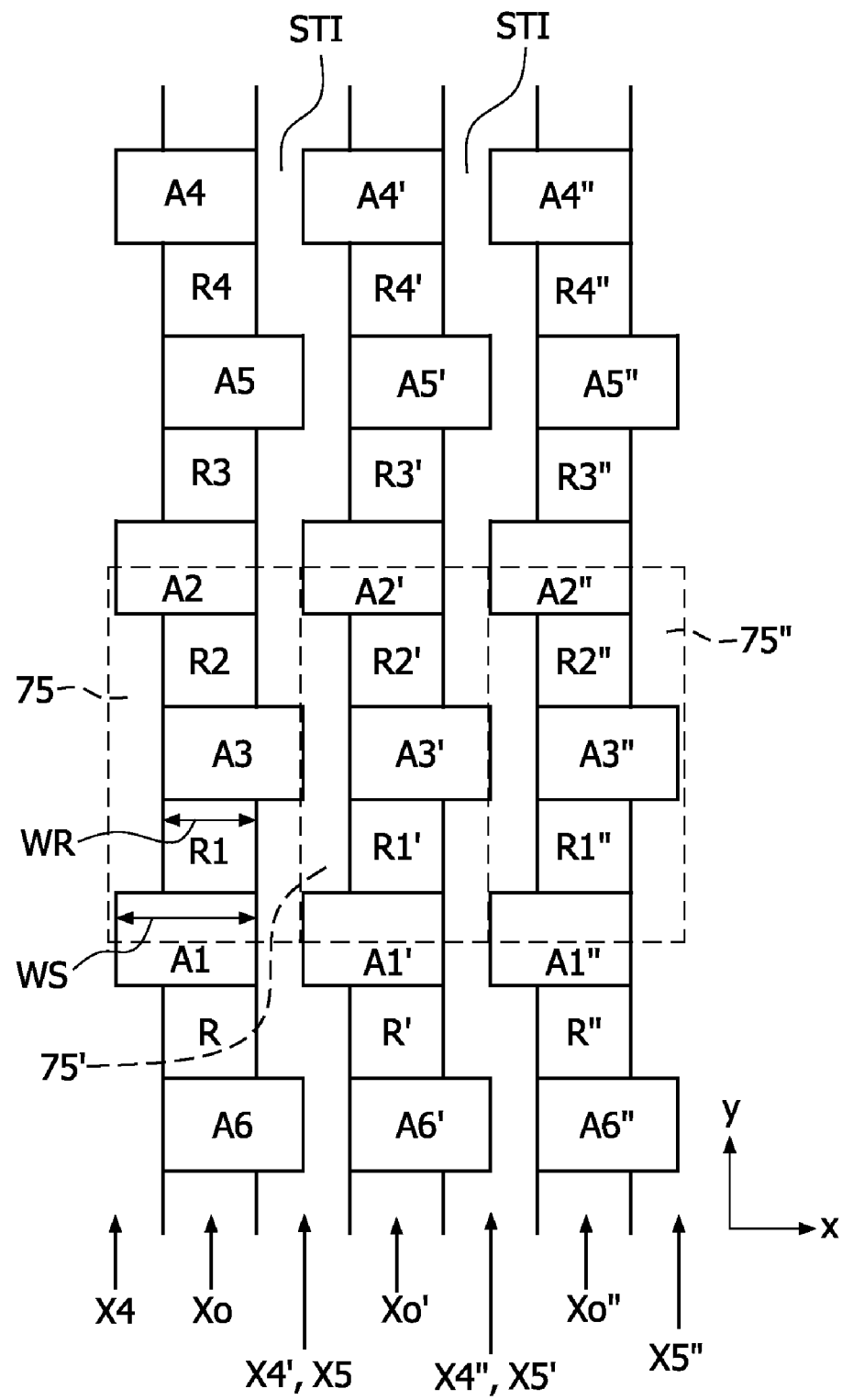
FIGS. 8a, 8b, 8c, 8d show a top view of an arrangement of memory cells in the AND-array according to a second embodiment.

In FIG. 8a the arrangement of non-volatile memory cells is shown on a level of the zero layer (i.e., the surface of the semiconductor substrate). By way of example, three areas 75, 75', 75" are shown that each comprise a non-volatile memory cell. The areas 75, 75', 75" are adjacent to each other in the direction X. Each non-volatile memory cell 75; 75'; 75" is demarcated by a dashed-line rectangle.

Each non-volatile memory cell 75; 75'; 75" comprises a first diffusion region A1; A1'; A1" and a second diffusion region A2; A2'; A2" which are to be connected to the first bit line BL-1; BL-1'; BL-1" and the second bit line BL-2; BL-2'; BL-2", respectively.

In between the first diffusion region A1; A1'; A1" and the second diffusion region A2; A2'; A2" a common diffusion region A3; A3'; A3" is arranged which is connected to the sensing line BL-S; BL-S'; BL-S".

In the semiconductor substrate a further active area Si extends in the second direction Y for providing channel regions R1; R1'; R1" in between the first diffusion region A1; A1'; A1" and the common diffusion region A3; A3'; A3", and channel regions R2; R2'; R2" in between the second diffusion region A2; A2'; A2" and the common diffusion region A3; A3'; A3".

The width ws (in direction X) of first, second and common diffusion regions A1; A1'; A1"; A2; A2'; A2"; A3; A3'; A3" is somewhat larger than the width wr of the first and second channel regions R1; R1'; R1"; R2; R2'; R".

In the non-volatile memory cell 75; 75'; 75", the first, second and common diffusion regions A1; A1'; A1"; A2; A2'; A2"; A3; A3'; A3" are arranged in a "staggered" fashion. In comparison to the (vertical boundaries of the) channel regions R1, R2, R3; R1', R2', R3'; R1", R2", R3", the first and second diffusion regions A1; A1'; A1"; A2; A2'; A2" protrude over a fourth horizontal distance X4; X4'; X4" in comparison to a centre position X0; X0'; X0" of the channel regions while the intermediate common diffusion region A3; A3'; A3" protrudes over a fifth horizontal distance X5; X5'; X5" in comparison to the centre position X0; X0'; X0" of the channel regions which fifth distance X5; X5'; X5" has an opposite direction than the fourth displacement X4; X4'; X4". Note that substantially X5 overlaps with X4', and X5' overlaps with X4".

In each memory cell the first memory transistor A is to be created between the first diffusion region A1; A1'; A1" and the common diffusion region A3; A3'; A3". The second memory transistor B is to be created between the second diffusion region A2; A2'; A2" and the common diffusion region A3; A3'; A3".

Note that in two non-volatile memory cells adjacent to each other in the direction Y, the order of memory transistors A and B in one of the memory cells is reversed in comparison to the other neighbor memory cell. Thus in direction Y a series of memory cells can be described by the order of A and B memory transistors in that direction as follows: AB (a first cell), BA (second cell), AB, BA, AB, BA, AB, BA, and so on.

The channel regions and diffusion regions of one non-volatile memory cell in one vertical column X0; X0'; X0" are isolated from the same regions and diffusion regions of an non-volatile memory cell 50' in an adjacent column by means of a shallow trench isolation STI.

Figure 8B:
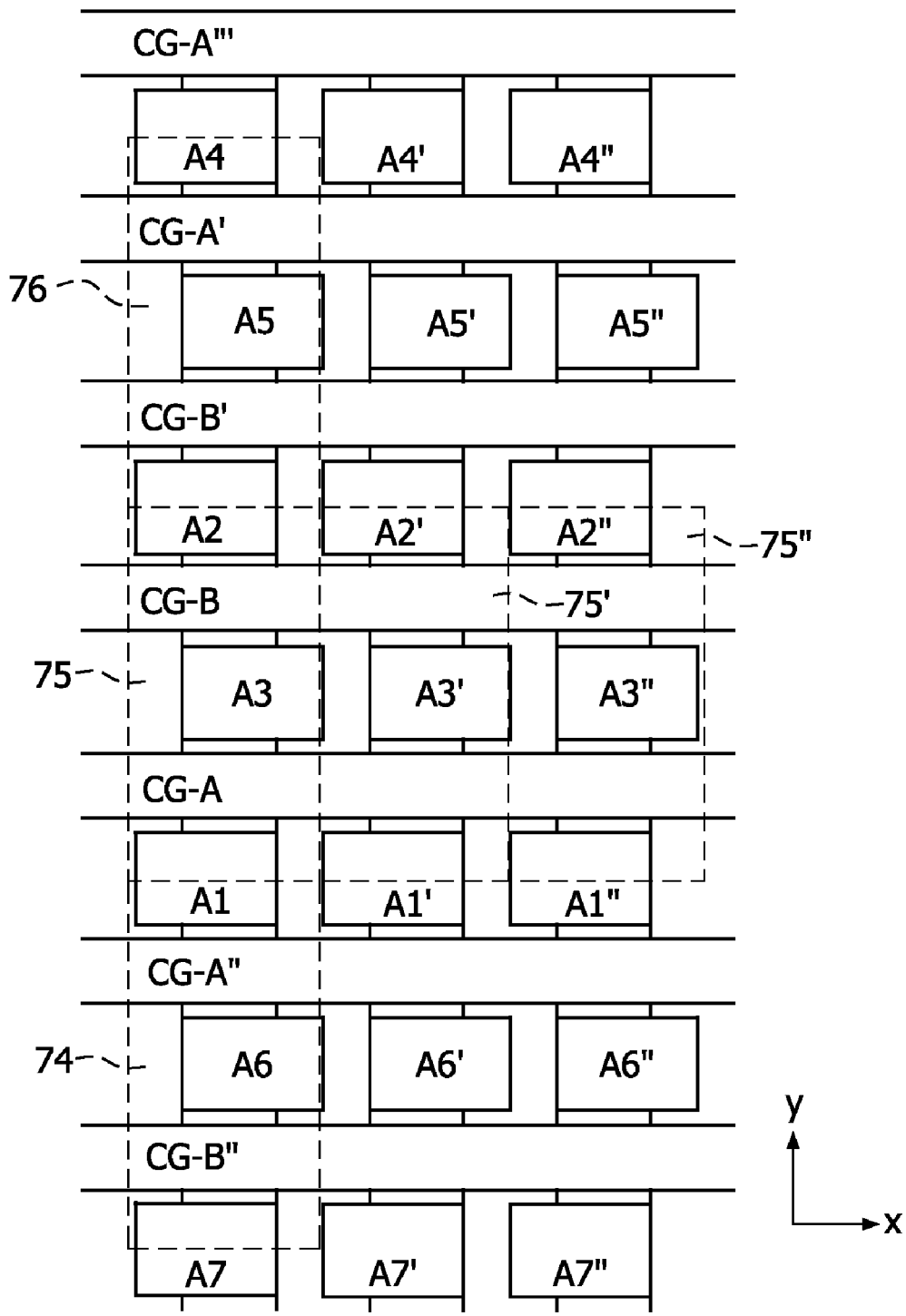

In FIG. 8b the arrangement of non-volatile memory cells is shown on a level of the word lines (control gate lines).

The first control gate line CG-A is positioned above the first channel region R1; R1'; R1" of the non-volatile memory cell 75; 75'; 75" and extends along the first direction X. Intermediate the first channel region R1; R1'; R1" and the first control gate line CG-A a charge storage element (not shown) is located. This will be illustrated below. The charge storage element is composed of an ONO stack.

The second control gate line CG-B is positioned above the second channel region R2; R2'; R2" of the non-volatile memory cell 75; 75'; 75" and extends along the first direction X. Likewise, intermediate the second channel region R2; R2'; R2" and the second control gate line CG-B a charge storage element (not shown) is located.

The control gate lines CG-A, CG-B comprise sidewall spacers (not shown here).

Non-volatile memory cell 76 which is adjacent to memory cell 75 in direction Y, also comprises a first and second control gate line, denoted here as CG-A' and CG-B'. Note that due to the alternating order of A and B transistors along the direction Y, there is also an alternating order of control gate lines CG-A, CG-A', CG-A" relating to A-transistors and control gate lines CG-B, CG-B', CG-B" relating to B-transistors. The control gate line CG-B' of non-volatile memory cell 76 is adjacent to the control gate line CG-B of the non-volatile memory cell 75. In the other neighboring memory cell 74 of the memory cell 75 along direction Y, a control gate line CG-A" is adjacent to the control gate line CG-A of the non-volatile memory cell 75.

Figure 8C:
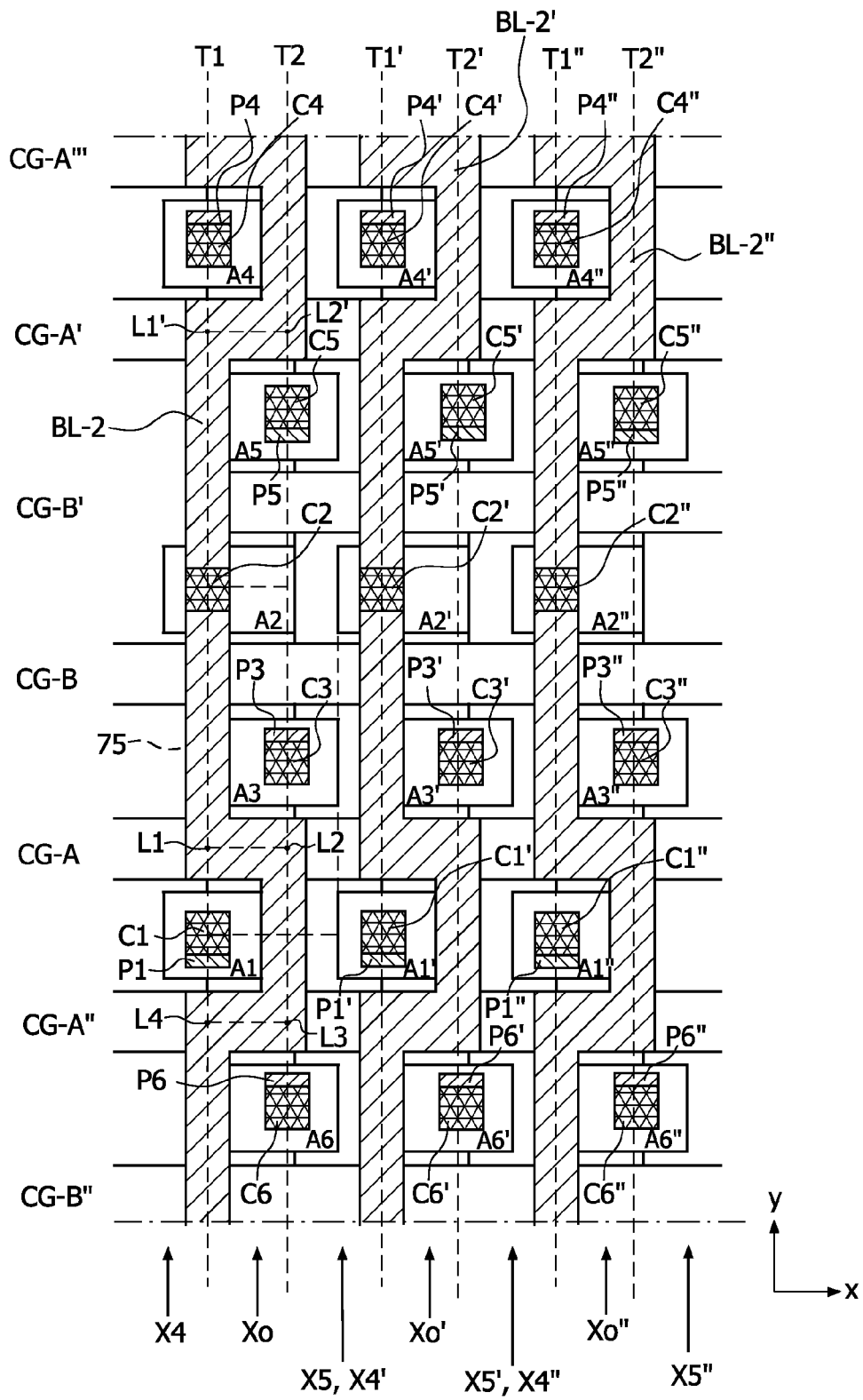

In FIG. 8c the arrangement of non-volatile memory cells is shown on a first metal level ML1.

On each of the first, second and common diffusion regions A1, A2, A3; A1', A2', A3'; A1", A2", A3", a respective contact C1, C2, C3; C1', C2', C3'; C1", C2", C3" is arranged for connecting to bit-lines and sensing lines BL-1, BL-2, BL-S; BL-1', BL-2', BL-S'; BL-1", BL-2", BL-S", respectively.

The first and second contact C1, C2; C1', C2'; C1", C2"; C1''', C2''' on the first diffusion region A1; A1'; A1"; A1''' and second diffusion region A2; A2'; A2"; A2''', respectively, have a horizontal position X4; X4'; X4" along first direction X which is relatively displaced over a fourth distance in comparison with a horizontal central position X0; X0'; X0" of the channel regions R1, R2; R1', R2'; R1", R2"; R1''', R2'''.

The third contact C3; C3'; C3"; C3''' on the common diffusion region A3; A3'; A3"; A3''' has a horizontal position X5; X5'; X5" along first direction X which is relatively displaced over a fifth distance in comparison with the central horizontal position X0; X0'; X0" of the channel regions R1, R2; R1', R2'; R1", R2"; R1''', R2'''.

In this manner the contacts follow the staggered arrangement of the diffusion regions in each non-volatile memory cells 75, 75', 75".

Note that the contacts C1, C2; C1', C2'; C1", C2" to the first and second diffusion regions A1, A2; A1', A2'; A1", A2" are on the same first vertical line at position X4; X4'; X4". The contacts C3; C3'; C3" are on a same second vertical line at position X5; X5'; X5" which runs parallel to the first vertical line To provide connections to the first and second bit lines BL-1, BL-2; BL-1', BL-2'; BL-1", BL-2", a metallization scheme with a first metal level ML1 and a second metal level ML2 is used. The second metal level ML2 is arranged above the first metal level ML1 and is galvanically isolated from the first metal level ML1.

By distributing the bit and sensing lines over the first and second metal levels an improved area efficiency of the non-volatile memory cell AND-array is provided.

According to the embodiment shown here, the second bit line BL-2, BL-2'; BL-2" to the contact C2 of the B-transistor is arranged in a first metal level ML1, the first bit line BL-1; BL-1'; BL-1" and the sensing line BL-S; BL-S'; BL-S" are arranged in the second metal level ML2 which is arranged above the first metal level ML1.

In the first metal level ML1, the contact C2; C2'; C2" of the second diffusion region A2; A2'; A2" is connected to the second bit line BL-2; BL-2'; BL-2". The second bit line BL-2; BL-2'; BL-2" extends in a column along the direction Y and contacts the second contact C2; C2'; C2" of each B-transistor A2; A2'; A2" in that column.

The second bit-line BL-2; BL-2'; BL-2" extends in the direction Y along a first common line T1; T1'; T1" in direction Y on which both first and second contacts C1, C2; C1', C2'; C1", C2" are positioned. To avoid a connection of the second bit line BL-2; BL-2'; BL-2" to the first contact C1; C1'; C1" of each A-transistor A1; A1'; A1", the second bit line is put round each first contact C1; C1'; C1" of each A-transistor along a U-shaped path within the first metal level ML1 and then continues along the first common line in direction Y. For reason of clarity the U-shaped path L1-L2-L3-L4 has only been indicated around contact C1.

Substantially above a control gate line CG-A; CG-A'; CG-A" (location L1 near contact C1) the second bit line is directed along the direction X until the second bit line reaches a second vertical line T2; T2'; T2" along direction Y on which contacts C3, C5, C6; C3', C5', C6'; C3", C5", C6" are positioned (location L2 near contact C2). Then the second bit line extends again in the original direction Y along the second vertical line T2; T2'; T2" until it reaches the next control gate line of a first memory A-transistor (location L3 near contact C1). At this location L3 the second bit line BL-2; BL-2'; BL-2" extends along that next control gate line in the direction of the first vertical common line. After reaching the original first common vertical line T1; T1'; T1" (at location L4 near contact C1), the second bit line extends again along the first common vertical line in the original direction Y.

Strictly, the connection between the first and common diffusion region and the first bit line and the sensing line respectively, comprises a contact and a via. This will be illustrated in more detail with reference to FIGS. 9-15. As known to persons skilled in the art, a contact extends from a diffusion region to the first metal level. At the first metal level a landing pad is provided on the contact. Next, a via connects to the landing pad and extends to the second metal level.

In FIG. 8c landing pads P1, P3, P4, P5, P6; P1', P3', P4', P5', P6'; P1", P3", P4", P5", P6" are schematically indicated at contact C1, C3, C4, C5, C6; C1', C3', C4', C5', C6'; C1", C3", C4", C5", C6".

Figure 8D:
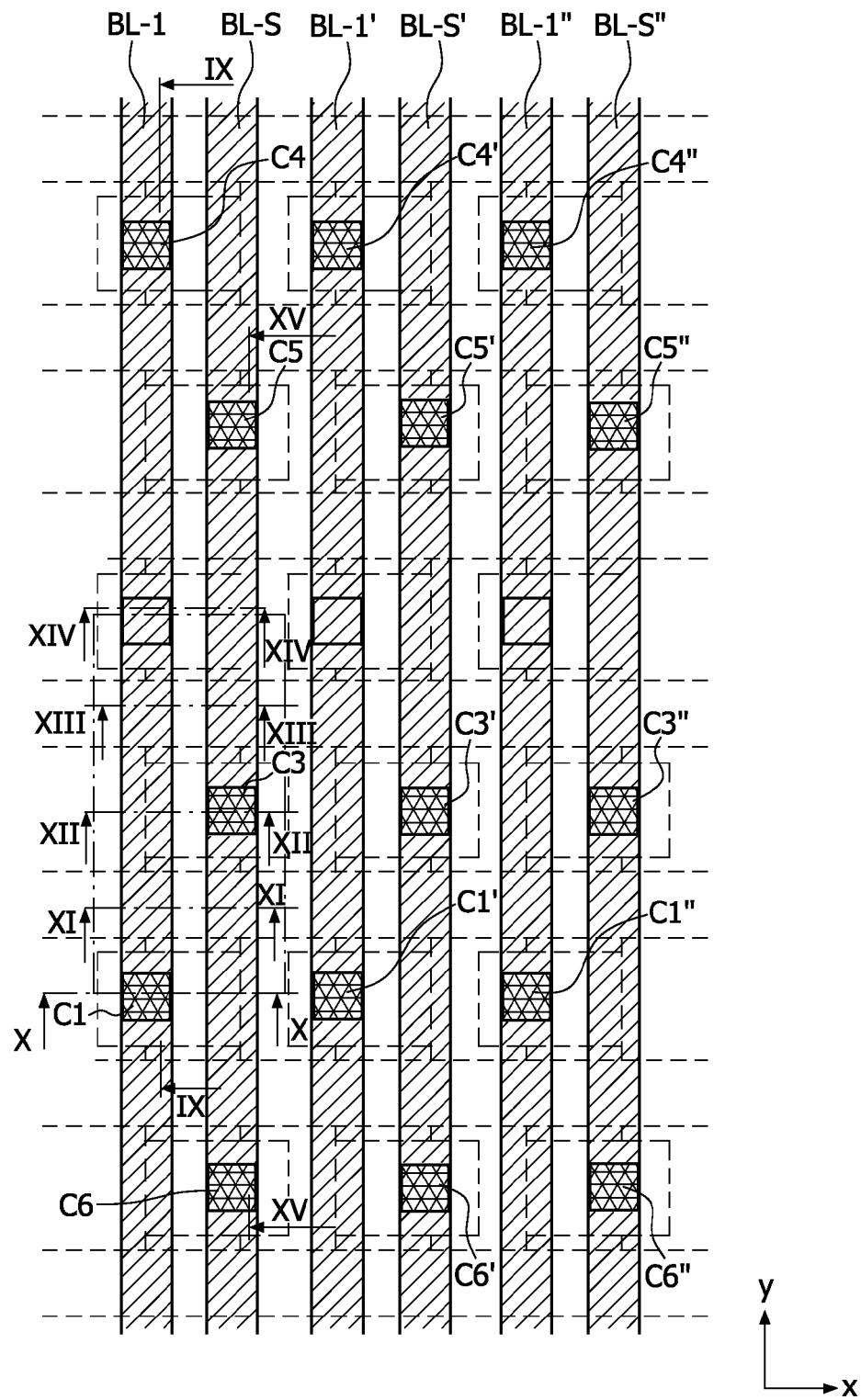

FIG. 8d shows the arrangement of non-volatile memory cells in the second metal level ML2.

In the second metal level ML2, above the first metal level ML1, connections of the first diffusion region A1; A1'; A1" and the common diffusion region A3; A3'; A3" of each memory cell are provided to the first bit line BL-1; BL-1'; BL-1" and the sensing line BL-S; BL-S'; BL-S", respectively. The contact C2; C2'; C2" between the second diffusion region A2; A2'; A2" and the second bit line BL-2; BL-2'; BL-2" shown in phantom, is below the first bit line BL-1; BL-1'; BL-1" but electrically independent from the first bit line.

The first bit line BL-1; BL-1'; BL-1" and the sensing line BL-S; BL-S'; BL-S" are substantially straight lines running in parallel along the direction Y.

The first metal level ML1 is separated from the second metal level ML2 by an intermediate dielectric layer. The first bit lines and the sensing lines in the second metal level ML2 are separated also by a dielectric.

Cross-sections along lines IX-IX, X-X, XI-XI, XII-XII, XIII-XIII, XIV-XIV, XV-XV are shown in the following FIGS. 9-15.

Figure 9:
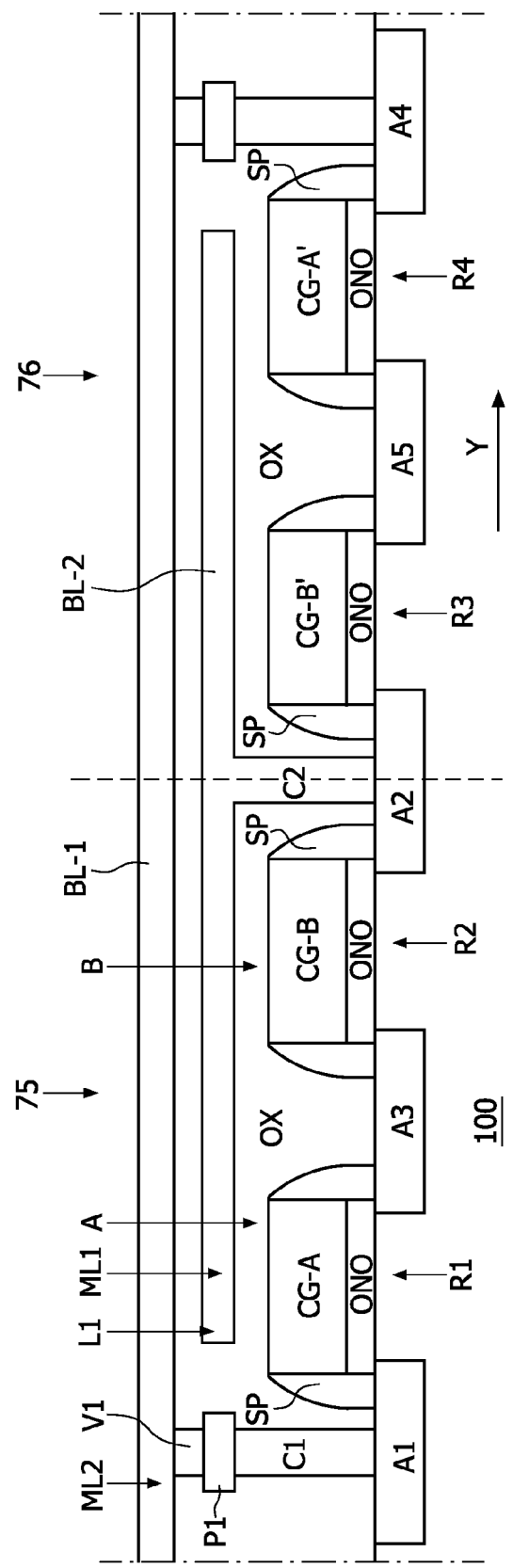
FIG. 9 shows a first cross-sectional view of a memory cell in the AND-array of the second embodiment.

FIG. 9 shows two adjacent non-volatile memory cells 75, 76 in the AND-array of the second embodiment in a first cross-section along line IX-IX.

Line IX-IX extends along direction Y and crosses the diffusion regions A1, A3, A2, A5, A4 and channel regions R1, R2, R3 and R4 as well as contacts C1, C2, C4. The first non-volatile memory cell 75 comprises a memory transistor A and a memory transistor B. The memory transistor A comprises diffusion regions A1 and A3, channel region R1, charge storage element ONO and control gate line CG-A. The memory transistor B comprises diffusion regions A2 and A3, channel region R2, charge storage element ONO and control gate line CG-B. The arrangement of the transistors A, B has been described in more detail above and is omitted here.

The second non-volatile memory cell 76 comprises a memory transistor A' and a memory transistor B'. The first memory transistor A' comprises diffusion regions A4 and A5, channel region R4, charge storage element ONO and control gate line CG-A'. The memory transistor B' comprises diffusion regions A2 and A5, channel region R3, charge storage element ONO and control gate line CG-B'. The second non-volatile memory cell 76 has an identical structure as the first non-volatile memory cell 75, except that the position of the memory A' and B' transistors is mirrored in comparison to the A, B positions in the first non-volatile memory cell 75.

The differential non-volatile memory cells 75, 76 have the diffusion region A2 in common. Diffusion region A2 is connected to contact C2, which provides a connection to the second bit-line BL-2 in the first metal level ML1. In this cross-section the second bit line BL-2 extends from the location L1 above the control gate line CG-A of first non-volatile memory cell 75 to the location L1' above the control gate line CG-A' of the second non-volatile memory cell 76.

The diffusion region A1 of the memory transistor A of the first non-volatile memory cell 75 is connected to the first bit-line BL-1 in the second metal level ML2 through a stack of the contact C1, the landing pad P1 and the via V1.

Likewise, the diffusion region A4 of the memory transistor A' of the second non-volatile memory cell 76 is connected to the first bit-line BL-1 in the second metal level ML2 through a stack of the contact C4, the landing pad P4 and the via V4.

Figure 10:
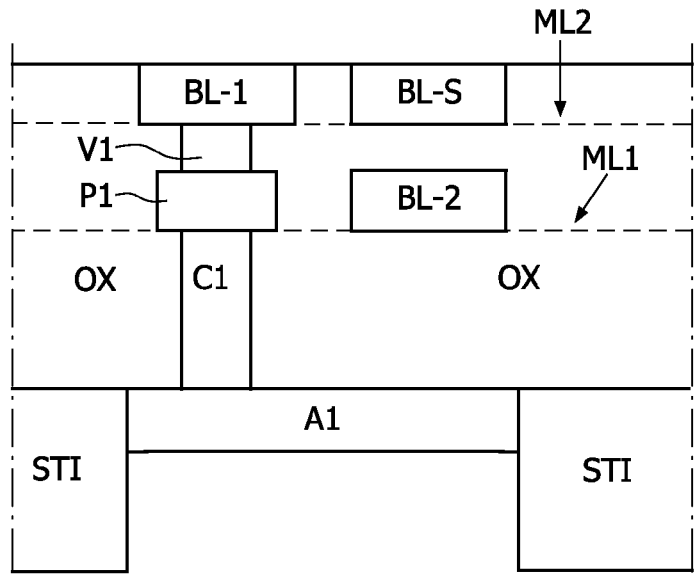
FIG. 10 shows a second cross-sectional view of a memory cell in the AND-array of the second embodiment.

FIG. 10 shows the memory cell 75 in the AND-array of the second embodiment in a second cross-section along line X-X.

In the surface of the semiconductor substrate the diffusion region A1 of the memory transistor A of the first non-volatile memory cell 75 is connected to contact C1. The via-metal-contact stack C1, P1, V1 is connected to the first bit-line BL-1 in the second metal level ML2. Next to the first bit line BL-1, the sensing line BL-S is located. Below the sensing line BL-S, the second bit line BL-2 is located in the first metal level ML1.

Figure 11:
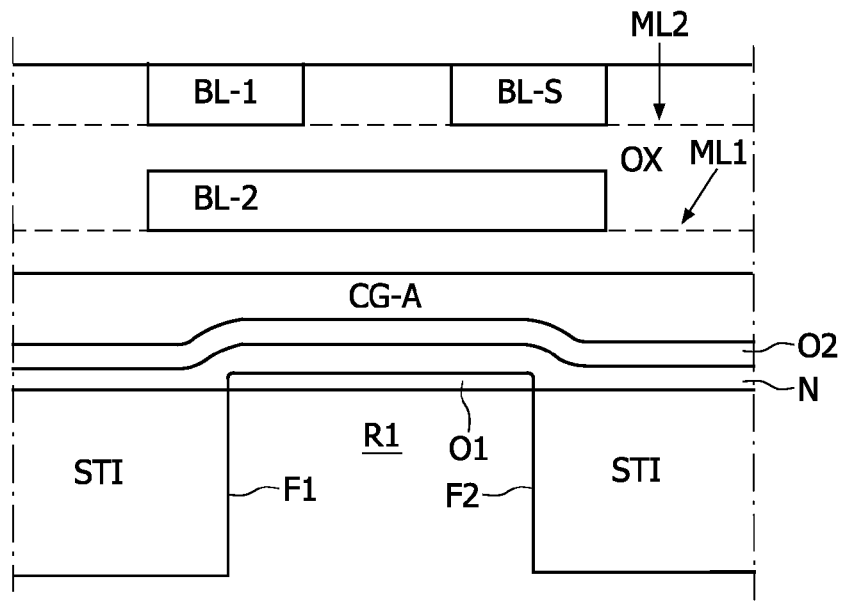
FIG. 11 shows a third cross-sectional view of a memory cell in the AND-array of the second embodiment.

FIG. 11 shows the memory cell 75 in the AND-array of the second embodiment in a third cross-section along line XI-XI.

In the surface of the semiconductor substrate the channel region R1 of the memory transistor A is arranged, in between shallow trench isolations STI.

As explained before, above the channel region R1 the stack of the charge trapping layer ONO and the control gate CG-A is positioned. A description of the stack of the charge trapping layer ONO and the control gate CG-A is given with reference to FIG. 6 and is omitted here.

Substantially above one interface F1 between channel region R1 and shallow trench isolation STI, the second bit line BL-2 is located in the first metal level ML1. Above the second bit line BL-2, the first bit line BL-1 is located in the second metal level ML2.

Substantially above the other interface F2 between channel region R1 and shallow trench isolation STI, the sensing line BL-S is located in the second metal level ML2, adjacent to the first bit line BL-1.

Figure 12:
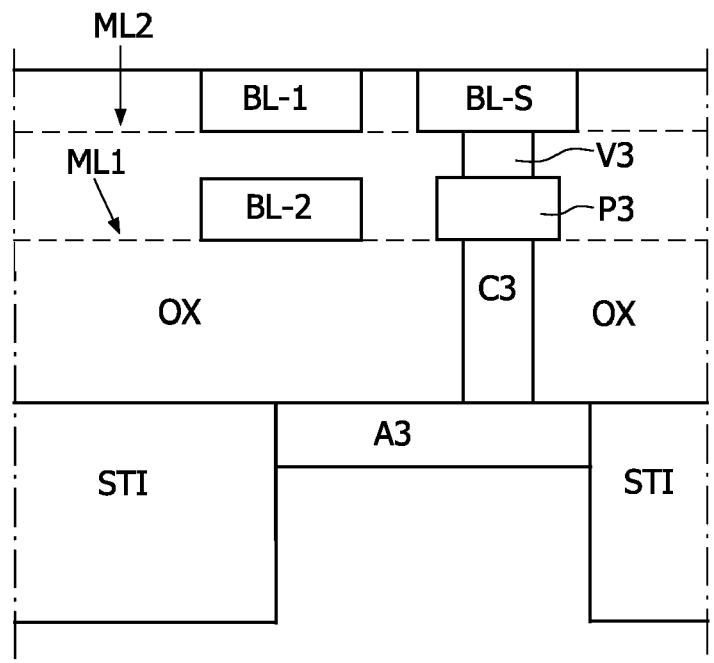
FIG. 12 shows a fourth cross-sectional view of a memory cell in the AND-array of the second embodiment.

FIG. 12 shows the memory cell 75 in the AND-array of the second embodiment in a fourth cross-section along line XII-XII.

In the surface of the semiconductor substrate the diffusion region A3 which is common to the memory transistors A, B of the first non-volatile memory cell 75 is connected the sensing line BL-S in the second metal level ML2 through a stack of the contact C3, the landing pad P3 and the via V3. Next to the sensing line BL-S, the first bit line BL-1 is located. Below the first line BL-1, the second bit line BL-2 is located in the first metal level ML1.

Figure 13:
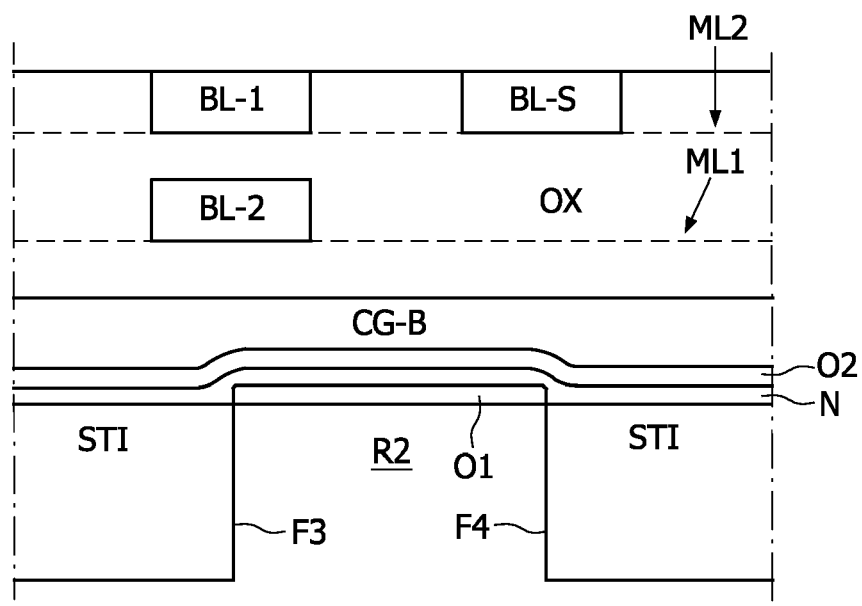
FIG. 13 shows a fifth cross-sectional view of a memory cell in the AND-array of the second embodiment.

FIG. 13 shows the memory cell in the AND-array of the second embodiment in a fifth cross-section along line XIII-XIII.

In the surface of the semiconductor substrate the channel region R2 of the memory transistor B is arranged, in between shallow trench isolations STI.

As explained before, above the channel region R1 the stack of the charge trapping layer ONO and the control gate CG-B is positioned. A description of the stack of the charge trapping layer ONO and the control gate CG-B is given with reference to FIG. 6 and is omitted here.

Substantially above one interface F3 between channel region R2 and shallow trench isolation STI, the second bit line BL-2 is located in the first metal level ML1. Above the second bit line BL-2, the first bit line BL-1 is located in the second metal level ML2.

Substantially above the other interface F4 between channel region R2 and shallow trench isolation STI, the sensing line BL-S is located in the second metal level ML2, adjacent to the first bit line BL-1.

Figure 14:
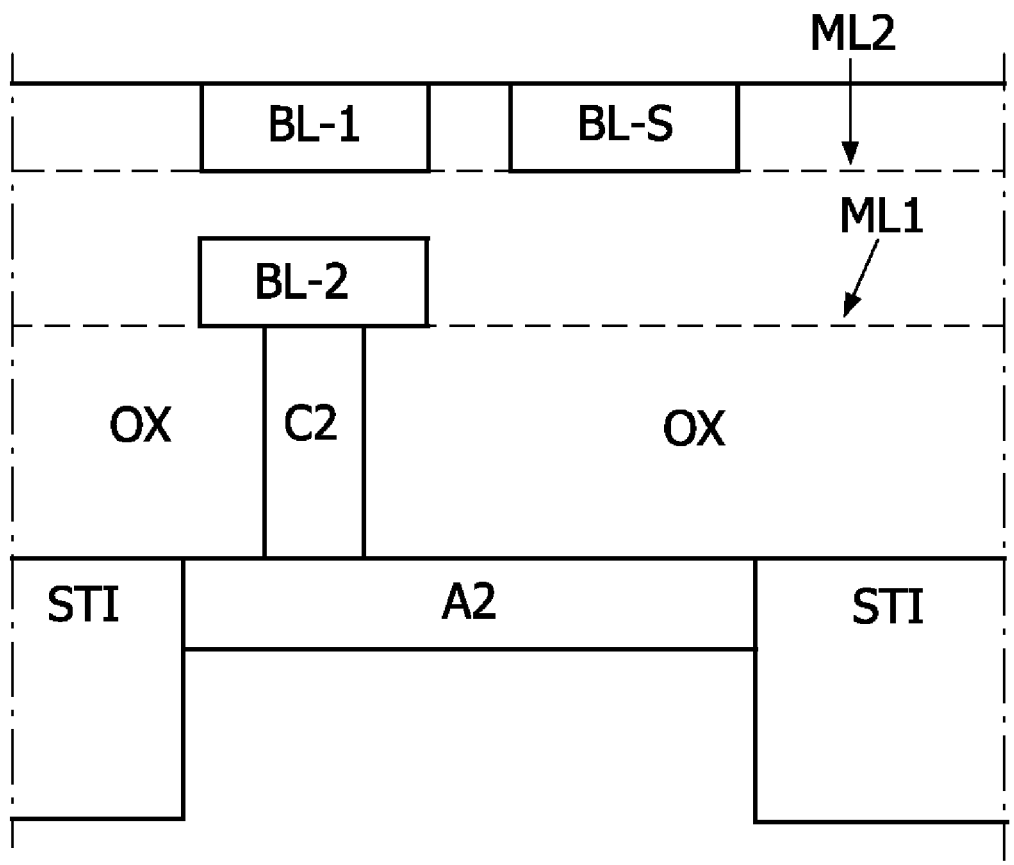
FIG. 14 shows a sixth cross-sectional view of a memory cell in the AND-array of the second embodiment.

FIG. 14 shows the memory cell 75 in the AND-array of the second embodiment in a sixth cross-section along line XIV-XIV.

In the surface of the semiconductor substrate the diffusion region A2 of the memory transistor B of the first non-volatile memory cell 75 is connected to contact C2. The contact C2 is connected to the second bit-line BL-2 in the first metal level ML1. Above the second bit line BL-2, separated by a dielectric OX the first bit line BL-1 is located in the second metal level ML2. The sensing line BL-S is adjacent to the first bit line BL-1 in the second metal level ML2.

Figure 15:
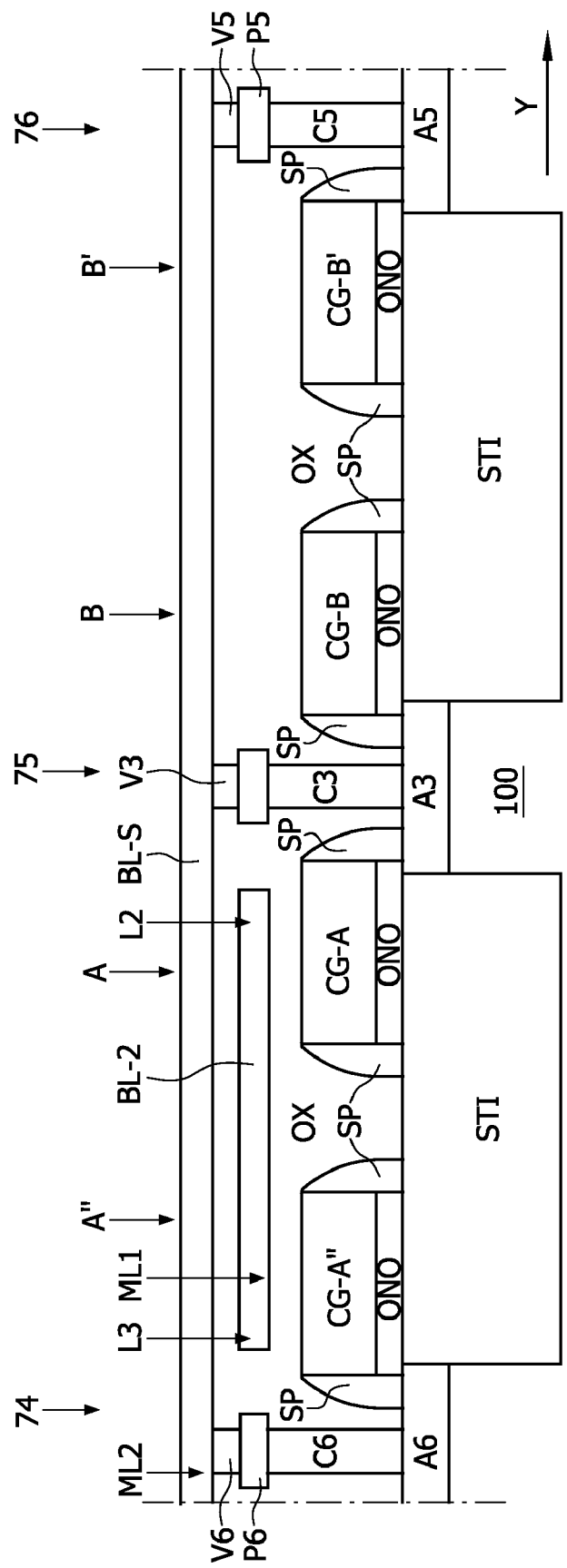
FIG. 15 shows the memory cell 75 in the AND-array of the second embodiment in a seventh cross-section along line XV-XV.

FIG. 15 shows the memory cell 75 in the AND-array of the second embodiment in a seventh cross-section along line XV-XV.

Line XV-XV extends along direction Y and crosses the diffusion regions A6, A3, A5, and contacts C6, C3, C5 and the shallow trench isolation region STI, but not any channel regions. The cross section XV-XV shows the non-volatile memory cell 75 and portions of adjacent non-volatile memory cells 74, 76 along the sensing line BL-S.

The structure of the memory cell 75, 74, 76 has been described above in more detail and is omitted here.

The diffusion region A3 is connected to the sensing line BL-S through a stack of the contact C3, the landing pad P3 and the via V3.

In a similar way, diffusion region A5 is connected to the sensing line BL-S through a stack of the contact C5, the landing pad P5 and the via V5 and the diffusion region A6 is connected to the sensing line BL-S through a stack of the contact C6, the landing pad P6 and the via V6.

Below the sensing line BL-S, the second bit line BL-2 extends in the same direction as the sensing line along the U-shaped path L1-L2-L3-L4 from location L2 to location L3.

It is noted that other layouts of first and second bit lines and sensing lines within two metal levels may be conceivable for providing a wiring scheme to the arrangement of the memory transistors A, B as shown in FIGS. 8*a* and 8*b*, but logically this will not result in a reduction of the cell size of the non-volatile memory cell 75. Also, other layouts within more than two metal levels can be used, but these other layouts will neither reduce the cell size of the non-volatile memory cell 75.

The invention claimed is:

1. Non-volatile memory cell on a semiconductor substrate comprising a first and a second transistor, each transistor being arranged as a memory element comprising two diffusion regions capable of acting as either source or drain, a charge storage element and a control gate element, a channel region being located intermediate the two diffusion regions; the charge storage element being located over the channel region, the control gate element being arranged on top of the charge storage element;
 - one diffusion region of the first transistor and one diffusion region of the second transistor forming a common diffusion region;
 - the other diffusion region of the first transistor being connected as first diffusion region to a first bit line, the other diffusion region of the second transistor being connected as second diffusion region to a second bit line and the common diffusion region being connected to a sensing line.

2. Non-volatile memory cell according to claim 1, wherein the first control gate element is connected to a first control gate line and the second control gate element is connected to a second control gate line; the first and second control gate lines forming a differential word line of the non-volatile memory cell.

3. Non-volatile memory cell according to claim 1, wherein
 - the first and second diffusion region have a relatively larger size, along a first direction, in comparison to a size along the first direction of channel regions and the common diffusion region, the first direction being at a non-zero angle with the second direction;
 - the first diffusion region protruding along the first direction in comparison to a central position of the common diffusion region, and
 - the second diffusion region protruding along the first direction in comparison to the central position of the common diffusion region, the protruding direction of the second diffusion region being opposite to the protruding direction of the first diffusion region.

4. Non-volatile memory cell according to claim 3, wherein
 - on each of the first, second and common diffusion regions a respective first, second and third contact is arranged for a connection to the first bit line, second bit line and sensing line, respectively;
 - the first contact on the first diffusion region-having a position along the first direction which is relatively displaced in comparison with the central position of the third contact on the common diffusion region;
 - the second contact on the second diffusion region having a second position along the first direction which is relatively displaced in comparison with the central position of the third contact on the common diffusion region, the displacement of the second contact being in a direction opposite to the direction of the displacement of the first contact.

5. Non-volatile memory cell according to claim 1, wherein the first bit line, the second bit line, and the sensing line are arranged in a first metal level, the first bit line, the second bit line, and the sensing line extending substantially in the second direction.

6. Non-volatile memory cell according to claim 1, wherein
 - the first, second and common diffusion region have a relatively larger size, along the first direction, in comparison to a size of the channel regions along the first direction, the first direction being at a non-zero angle with the second direction;
 - the first and second diffusion regions protruding along the first direction in comparison to a central position of the channel regions, and
 - the common diffusion region protruding along the first direction in comparison to the central position of the channel regions, the protruding direction of the common diffusion region being opposite to the protruding direction of the first and second diffusion regions.

7. Non-volatile memory cell according to claim 6, wherein the connection of the first diffusion region to the first bit line comprises a contact, a landing pad and a via, and the connection of the common diffusion region to the sensing line comprises a further contact, a further landing pad and a further via.

8. Non-volatile memory cell according to claim 6, wherein
 - on each of the first, second and common diffusion regions a first, second and third contact is arranged for a connection to the first bit-line, second bit line and sensing line, respectively;
 - the first and second contacts on the first diffusion region and the second diffusion region, respectively, having a position along the first direction which is relatively displaced in comparison with the central position of the channel regions;
 - the third contact on the common diffusion region having a position along the first direction which is relatively displaced in comparison with the central position of the channel regions, the displacement of the first and second contacts being in a direction opposite to the direction of the displacement of the third contact.

9. Non-volatile memory cell according to claim 8, wherein the second bit line is arranged in a first metal level and
 - the first bit line and the sensing line arranged in a second metal level,
 - the second metal level being galvanically, isolated from the first metal level by an intermediate dielectric layer and being arranged above the first metal level;
 - the first bit line, the second bit line, and the sensing line extending substantially in the second direction.

10. Non-volatile memory cell according to claim 9, wherein the second bit line is put round the first contact of the first memory transistor along a U-shaped path within the first metal level.

11. Non-volatile memory cell according to claim 1, wherein the charge storage element comprises a first insulating layer, a charge trapping layer and a second insulating layer.

12. Non-volatile memory cell according to claim 6, wherein the connection of the first diffusion region and the common diffusion region to the first bit line and the sensing line respectively comprises a contact, a landing pad and a via.

13. Non-volatile memory AND-array comprising a plurality of non-volatile memory cells according to claim 1, said non-volatile memory cells each having a pair of a first and a second memory transistor, and said non-volatile memory cells being arranged in a configuration of at least one column and at least one row, the diffusion region of first memory transistors in the same at least one column connecting to the same first bit line, the diffusion region of the associated second memory transistors in the same at least one column connecting to the same second bit line, and the common drain/source of the first and second memory transistors in the same at least one column connecting to the same sensing line;

in said at least one row, the first control gate line extending in a row direction to connect to the first control gate element of each first memory transistor that is in the same at least one row, and the second control gate line extending in the row direction to connect to the second control gate element of each second memory transistor (B) that is in the same at least one row.

14. Method of operation of a memory AND-array in accordance with claim 13;

the method of operating comprising:

exposing the first transistor of a non-volatile memory cell to a first voltage between the control gate and the channel region and exposing the second transistor of the non-volatile memory cell to a second voltage between the control gate and the channel region, the second voltage being substantially identical to the first voltage.

15. Method of operation of a memory AND-array according to claim 14, comprising a reading operation which comprises:

sensing a first threshold voltage of the first transistor of a non-volatile memory cell and a second threshold voltage of the second transistor of the non-volatile memory cell;

comparing the first and second threshold voltages;

determining from the comparison of the first and second threshold voltages a bit value of the non-volatile memory cell.

16. Method of operation of a memory AND-array according to claim 15, wherein the action of sensing the threshold voltages comprises:

biasing the sensing line with a sensing voltage and biasing the control gate of the first and second transistor of the non-volatile memory cell with a read voltage.

17. Method of operation of a memory AND-array according to claim 14, comprising an erasing operation which comprises:

applying an erasure voltage to the control gate of the first transistor and the second transistor of a non-volatile memory cell, the erasure voltage having a negative sign and substantially simultaneously applying a zero voltage to the first bit line, the second bit line and the sensing line.

18. Method of operation of a memory AND-array according to claim 14, comprising a programming operation which comprises:

applying a first programming pulse to the first control gate of the first memory transistor of a non-volatile memory cell to be programmed and inhibiting programming of all other non-volatile memory cells sharing the same control gate line that should not be programmed by biasing the first and second bit lines and the sensing lines of those other non-volatile memory cells at an inhibit voltage;

applying a second programming pulse to the second control gate line of the second memory transistor of the non-volatile memory cell to be programmed and inhibiting all non-volatile memory cells-sharing the same second control gate line, including the second memory transistor of the non-volatile memory cell, which cells should not be affected by the programming pulse, by applying the inhibit voltage on the first and second bit lines and sensing lines of the non-volatile memory cells not to be affected.

19. Method of operation of a memory AND-array according to claim 14, comprising a programming operation which comprises:

applying a first programming pulse to the first control gate of all first transistors to be programmed of all non-volatile memory cells sharing the same control gate line and at the same time providing, by means of an inhibit pattern, an inhibit voltage o all second transistors of non-volatile memory cells sharing the same second control gate line, the second control gate line being associated with the first control gate line; next, inverting the inhibit pattern for inhibiting all first transistors and for inhibiting all second transistors of non-volatile memory cells of which the accompanying first transistor was programmed during the first programming pulse;

by means of the inverted inhibiting pattern, inhibiting all first transistors and inhibiting all second transistors of non-volatile memory cells of which the accompanying first transistor was programmed during the first programming pulse;

applying the second programming pulse to second transistors of non-volatile memory cells of which the accompanying first transistor was not programmed during the first programming pulse.

20. Semiconductor device comprising at least one non-volatile memory cell in accordance with claim 1.

21. Semiconductor device comprising at least one non-volatile memory AND-array in accordance with claim 13.

\* \* \* \* \*